United States Patent
Vogeley

(10) Patent No.: US 7,322,803 B2
(45) Date of Patent: Jan. 29, 2008

(54) PUMPS WITH DIAPHRAGMS BONDED AS BELLOWS

(75) Inventor: James Vogeley, Yorktown, VA (US)

(73) Assignee: Adaptivenergy, LLC., Hampton, VA (US)

(*) Notice: Subject to any disclaimer, the term of this patent is extended or adjusted under 35 U.S.C. 154(b) by 0 days.

(21) Appl. No.: 11/024,943

(22) Filed: Dec. 30, 2004

(65) Prior Publication Data

US 2006/0147325 A1   Jul. 6, 2006

(51) Int. Cl.
*F04B 17/00* (2006.01)
(52) U.S. Cl. .................. 417/413.2; 417/480
(58) Field of Classification Search ........... 417/413.2, 417/480, 413.3
See application file for complete search history.

(56) References Cited

U.S. PATENT DOCUMENTS

| | | | |
|---|---|---|---|
| 4,773,218 A | 9/1988 | Wakita et al. | |
| 4,927,084 A | 5/1990 | Brandner et al. | |
| 5,338,164 A | 8/1994 | Sutton et al. | |
| 5,759,015 A | 6/1998 | Van Lintel et al. | |
| 5,811,911 A | 9/1998 | Jänker et al. | |
| 6,042,345 A | 3/2000 | Bishop et al. | |
| 6,071,088 A | 6/2000 | Bishop et al. | |
| 6,074,178 A | 6/2000 | Bishop et al. | |
| 6,120,264 A * | 9/2000 | Wang | 417/480 |
| 6,751,954 B2 | 6/2004 | Bridger et al. | |
| 6,761,028 B2 | 7/2004 | Takeuchi et al. | |
| 6,811,093 B2 | 11/2004 | Rado | |
| 6,869,275 B2 | 3/2005 | Dante et al. | |
| 2005/0258715 A1 | 11/2005 | Schlabach | |

FOREIGN PATENT DOCUMENTS

JP          357199399 A   * 12/1982

OTHER PUBLICATIONS

International Preliminary Report on Patentability mailed Jul. 12, 2007 in corresponding PCT application PCT/US2005/047355.
International Preliminary Report on Patentability mailed Jul. 12, 2007 in corresponding PCT application PCT/US2005/047356.
International Search Report and Written Opinion mailed May 8, 2007 in PCT application PCT/US06/13854.

* cited by examiner

*Primary Examiner*—Charles G Freay
(74) *Attorney, Agent, or Firm*—Nixon & Vanderhye, P.C.

(57) ABSTRACT

A pump comprises a diaphragm assembly which includes a first diaphragm (22) having a first diaphragm edge (28) and a second diaphragm (24) having a second diaphragm edge (30). The first diaphragm edge (28) and the second diaphragm edge (30) are bonded together so that a bellows chamber (26) is formed between the first diaphragm (22) and the second diaphragm (24). At least one and possibly both of the first diaphragm (22) and the second diaphragm (24) is a piezoelectric diaphragm which displaces in accordance with application of an electrical signal. A driver applies the electrical signal to whichever of the first diaphragm (22) and the second diaphragm (24) is the piezoelectric diaphragm. The first diaphragm and the second diaphragm bow outwardly together and shrink in diameter during a suction stroke but flatten out and increase in diameter during a pump stroke.

18 Claims, 25 Drawing Sheets ated 14 Sep. 2001; U.S. patent application Ser. No.
PUMPS WITH DIAPHRAGMS BONDED AS BELLOWS

BACKGROUND

1. Field of the Invention

The present invention pertains to pumps which employ a diaphragm.

2. Related Art and Other Considerations

Diaphragm-type pumps typically comprise a pumping chamber defined by a diaphragm and a relatively rigid or stationary housing or enclosure in which the diaphragm is mounted. Fluid acted upon by the diaphragm is admitted into the pumping chamber through an inlet valve and exits the pumping chamber via an outlet valve. Although a central portion of the diaphragm moves in the pumping chamber, the diaphragm is clasped essentially entirely around its edge or periphery by the housing and usually retained in the stationary housing by some sort of flexible yet fluid-tight seal. Various means for clasping the diaphragm in the housing have been used, such as (for example) gaskets, O-rings, and adhesives.

Examples of pumps with an edge-clamped piezoelectric diaphragm are shown in PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", all of which are incorporated herein by reference.

In such pumps, whether utilizing piezoelectric or other types of diaphragms, the seal allows at least a central portion of the diaphragm to move laterally, while holding the periphery of the diaphragm somewhat rigidly longitudinally. The rigid mounting of the edge of diaphragm by the housing has an undesirable side effect of constricting the pumping motion performed by the diaphragm. It is estimated that some current pump designs with edge-engagement of the diaphragm constrict the motion of the diaphragm by as much as 30% to 50%, thereby limiting volumetric displacement per pump stroke.

What is needed, and an object of the present invention, is apparatus, method, and/or technique for operating a diaphragm pump without the undue constriction of the diaphragm.

BRIEF SUMMARY

A pump comprises a diaphragm assembly which includes a first diaphragm having a first diaphragm edge and a second diaphragm having a second diaphragm edge. The first diaphragm edge and the second diaphragm edge are bonded together so that a bellows chamber is formed between the first diaphragm and the second diaphragm. At least one and possibly both of the first diaphragm and the second diaphragm is a piezoelectric diaphragm which displaces in accordance with application of an electrical signal. A driver applies the electrical signal to whichever of the first diaphragm and the second diaphragm is the piezoelectric diaphragm (or to both the first diaphragm and the second diaphragm when both are piezoelectric diaphragms) for causing the first diaphragm and the second diaphragm to bow outwardly together and thereby shrink in diameter for sucking the fluid into the bellows chamber, and for causing the first diaphragm and the second diaphragm to flatten out and increase in diameter for expelling the fluid from the bellows chamber.

In a first example embodiment, an inlet port is formed in a central region of the first diaphragm and an outlet port is formed in a central region of the second diaphragm. The first diaphragm edge and the second diaphragm edge are essentially bonded together entirely around their periphery, whereby the bellows chamber forms a pumping chamber. Fluid is admitted into the pumping chamber through the inlet port and expelled from the pumping chamber through the outlet port.

In an example implementation of the first embodiment, an inlet valve is provided at the inlet port and an outlet valve is provided at the outlet port. The inlet valve has an inlet valve seat which is carried by the first diaphragm, so that the inlet valve is driven closed on a suction stroke of the pump but is driven open on a pump stroke. The outlet valve has an outlet valve seat which is carried by the second diaphragm so that the outlet valve is driven open during the suction stroke but driven closed on the pump stroke.

In one example implementation of the first embodiment, a stationary pump holder which serves to suspend the pump so that neither the first diaphragm nor the second diaphragm contacts any diaphragm-restraining stationary structure and so that both the inlet valve and outlet valve are unconstrained active valves. In a second example implementation of the first embodiment, one of the inlet valve and the outlet valve serves as a stationary mounting valve, so that neither the first diaphragm nor the second diaphragm contacts any stationary structure except the mounting valve. In this second example implementation, the mounting valve is a passive valve and the other valve is an active valve.

In another implementation of the first embodiment, the inlet port and the outlet port are axially offset with respect to a major axis of the first diaphragm and the second diaphragm.

In yet another implementation of the first embodiment, the inlet port and the outlet port are both formed on the first diaphragm. In such implementation, the second diaphragm is preferably secured or connected to a stationary mounting structure, but the first diaphragm does not contact any stationary structure.

In second and third example embodiments, the bellows chamber is auxiliary to and communicates with a working chamber defined by a housing. In the second example embodiment, the working chamber is a pumping chamber which has both an inlet port and an outlet port. The diaphragm assembly has an aperture or opening provided therein through which the bellows chamber communicates with the pumping chamber. The aperture can be provided, for example, in bonding between the first diaphragm edge and the second diaphragm edge. Action of the first diaphragm and the second diaphragm generates a pressure waveform in the bellows chamber for selectively causing impulsion of the fluid into the pumping chamber and expulsion of the fluid from the pumping chamber.

The pumping chamber of the second embodiment is stationary, with the first diaphragm and the second diaphragm being suspended from the pumping chamber and externally unconstrained. An inlet valve and an outlet valve are situated in the pumping chamber. A distance separating the inlet valve and the outlet valve is selected to enhance priming of the pump.

In the third example embodiment, which is a variation of the second example embodiment, a housing defines a working chamber which serves as a pressure chamber. The working chamber is in communication with the bellows chamber; the working chamber at least partially encloses a flexible member. At least a portion of the interior of the flexible member serves as the pumping chamber. Action of the first diaphragm and the second diaphragm generates a pressure waveform in the bellows chamber and in the pressure chamber. The pressure waveform selectively causes impulsion of the fluid into a portion of the flexible member which serves as the pumping chamber and expulsion of the fluid from the pumping chamber.

In a fourth example embodiment, a modular, cascadable pump component comprises a first diaphragm having a first diaphragm edge; a second diaphragm having a second diaphragm edge; with the first diaphragm edge and the second diaphragm edge being bonded together so that a bellows chamber is formed between the first diaphragm and the second diaphragm. The pump component is connectable to another pump component via either an inlet port or an outlet port of a pumping chamber. In an example implementation, at least one of the first diaphragm and the second diaphragm is a piezoelectric diaphragm which displaces in accordance with application of an electrical signal.

A pump system can be configured by cascading plural modular pump components or sections of the fourth embodiment together. At least one of the modular pump section comprises a first diaphragm having a first diaphragm edge; a second diaphragm having a second diaphragm edge; with the first diaphragm edge and the second diaphragm edge being bonded together so that a section pumping chamber is formed between the first diaphragm and the second diaphragm. The pump section is connectable to another pump section/component via either the inlet port or the outlet port so that the section pumping chambers of the plural modular pump sections communicate to form a composite pumping chamber. At least one of the first diaphragm and the second diaphragm is a piezoelectric diaphragm which displaces in accordance with application of an electrical signal.

The modular pumping sections of the fourth embodiment are coupled together to create a composite pumping chamber. In some implementations the pumping chambers of the plural pumping sections can be directly cascaded so that the composite pumping chamber is formed by the plural pumping chambers being in direct communication. In other implementations, one or more valves can be placed in the composite pumping chamber. For example, modular pumping sections having differing volumes can form a composite pumping chamber, preferably having a valve intermediately positioned therein, to form a two-stage compressor.

In a fifth example embodiment, a pumping system comprises a first pump assembly connected to receive fluid from a first fluid source and to deliver the fluid from the first fluid source, as well as a second pump assembly connected to receive fluid from a second fluid source and to deliver the fluid from the second fluid source. The delivery may be provided through separate fluid streams, or (optionally) to a mixing device. At least one of the first pump assembly and the second pump assembly comprises a first diaphragm having a first diaphragm edge; a second diaphragm having a second diaphragm edge; the first diaphragm edge and the second diaphragm edge being at least partially bonded together so that a bellows chamber is formed between the first diaphragm and the second diaphragm. The pumping system further comprises drive electronics for applying an electrical signal(s) to the piezoelectric diaphragm(s) for operating the first pump assembly and the second pump assembly for providing the fluid from the first fluid source and the fluid from the second fluid source to the mixing device.

For some implementations of the pumping system of the fifth embodiment, and in like manner as the second and third embodiments, either one or both of the first pump assembly and the second pump assembly has a housing which either defines or encloses a pumping chamber. The diaphragm assembly can have an aperture formed therein to permit the bellows chamber to communicate with an interior of the housing, and whereby action of the first diaphragm and the second diaphragm generates a pressure waveform in the bellows chamber and in the interior of the housing for selectively causing impulsion of the fluid through the inlet port into the pumping chamber and expulsion of the fluid from the pumping chamber through the outlet port. In like manner as the second embodiment, the housing can define the pumping chamber. Alternatively, as with the third embodiment, the housing can at least partially enclose a flexible member, with an interior of the flexible member serving as a pumping chamber. Action of the first diaphragm and the second diaphragm generates a pressure waveform in the bellows chamber and in the pumping chamber for selectively causing impulsion of the fluid into the pumping chamber and expulsion of the fluid from the pumping chamber In a first example implementation of the fifth embodiment, the drive electronics supplies a signal for overdriving both the first pump assembly and the second pump assembly. The pump system further comprises a physical constraint member having a position selected to limit displacement of a diaphragm of one or both the first pump assembly and the second pump assembly despite the pump assembly being overdriven. The position of the physical constraint member may be adjustable, e.g., the physical constraint may be adjustable such as, for example, an adjustable stop member whose position is adjustable by setting of a thumb screw or the like.

In a second example implementation of the fifth embodiment, the drive electronics applies a first electrical signal to the piezoelectric diaphragm of the first pump assembly and a second electrical signal to the piezoelectric diaphragm of the second pump assembly, the first electrical signal and the second electrical signal being applied for controlling a ratiometric mix in the mixing device of the fluid from the first fluid source and the fluid from the second fluid source. For example, the first drive signal and the second drive signal may differ and be adjustable with regard to one or more of the following parameters: amplitude, frequency, interleave.

A third example implementation of the fifth embodiment is a hybrid mechanical/electrical embodiment. The third implementation of the fifth embodiment is mechanical in that at least one of the pump assemblies has the physical constraint for limiting diaphragm displacement, and at least one (preferably both) of the pump assemblies are overdriven. The third implementation of the fifth embodiment is electrical in the sense that the first drive signal and the second drive signal may differ and be adjustable with regard to one or both of frequency and interleave, but not amplitude (the amplitude is fixed).

In the embodiments described herein, the first diaphragm edge and the second diaphragm edge are bonded together by various means such as the following examples: over molding; an adhesive sealant; an adhesive gasket. The first diaphragm edge and the second diaphragm edge can be bonded together by apron (e.g., a polyamide apron). If desired, an electrical lead for carrying the electrical signal to the piezoelectric diaphragm can be embedded in the apron.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

Figure 1A:
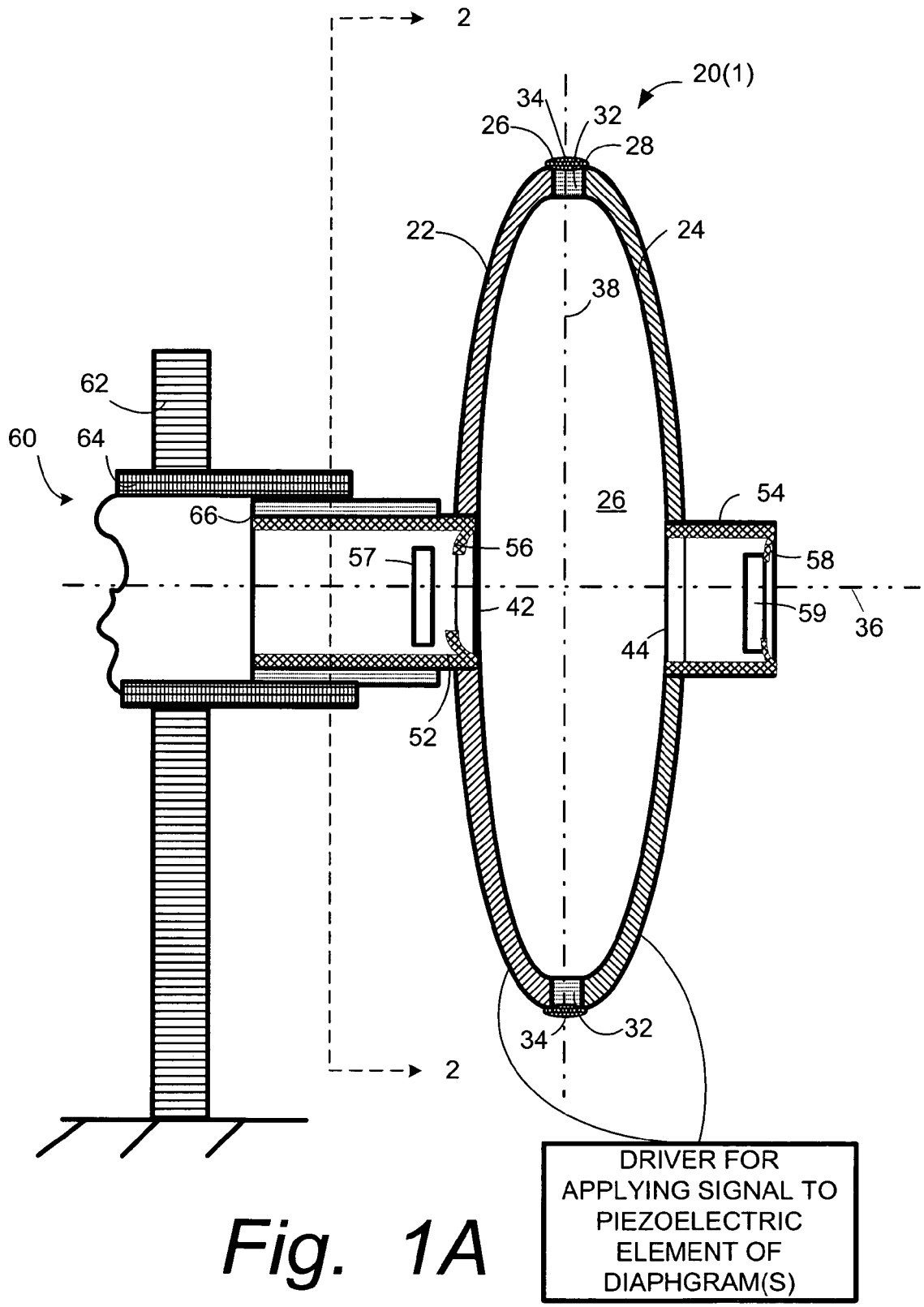
FIG. 1A is a cross sectioned side view of a pump according to a first example implementation of a first example embodiment, the pump having diaphragms bonded to form a bellows chamber which also serves as a pumping chamber, the pump being mounted so that the diaphragms thereof have free movement and both an inlet valve and an outlet valve are active, the pump being at a point of operation intermediate a full suction stroke and a full pump stroke.
Figure 1B:
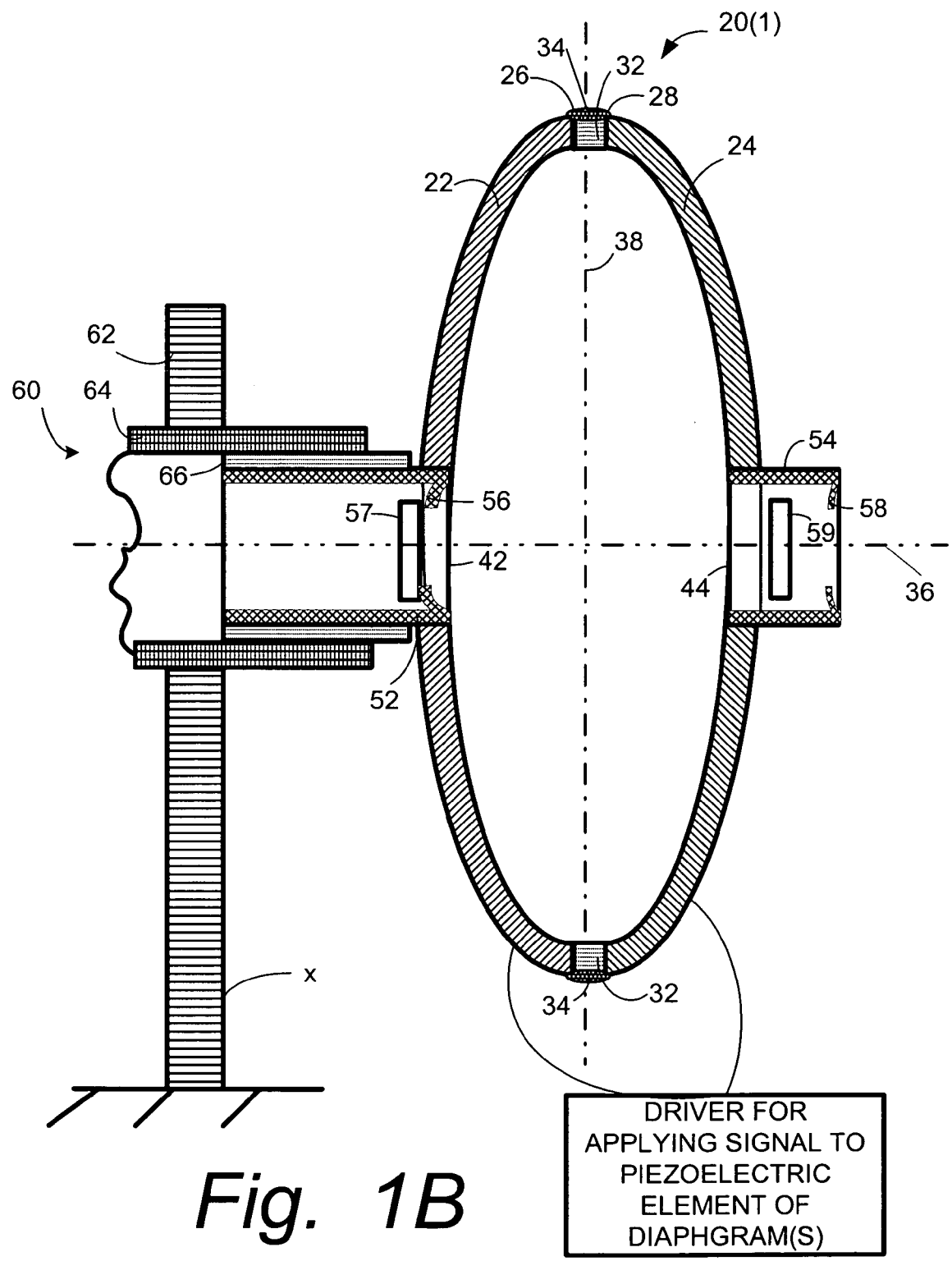
FIG. 1B is a cross sectioned side view of a pump of FIG. 1A at a full suction stroke.
Figure 1C:
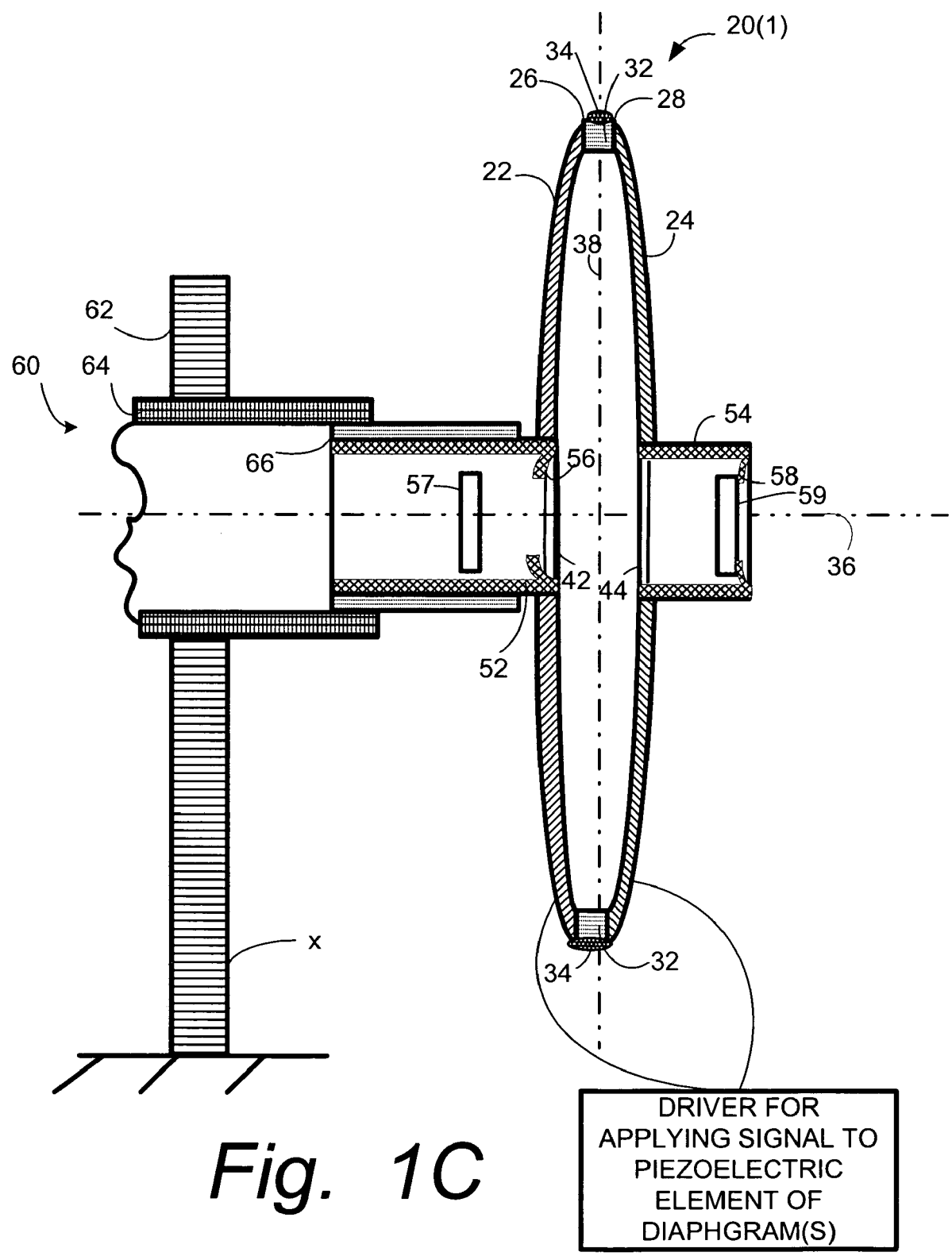
FIG. 1C is a cross sectioned side view of a pump of FIG. 1A at a full pump stroke.
Figure 2:
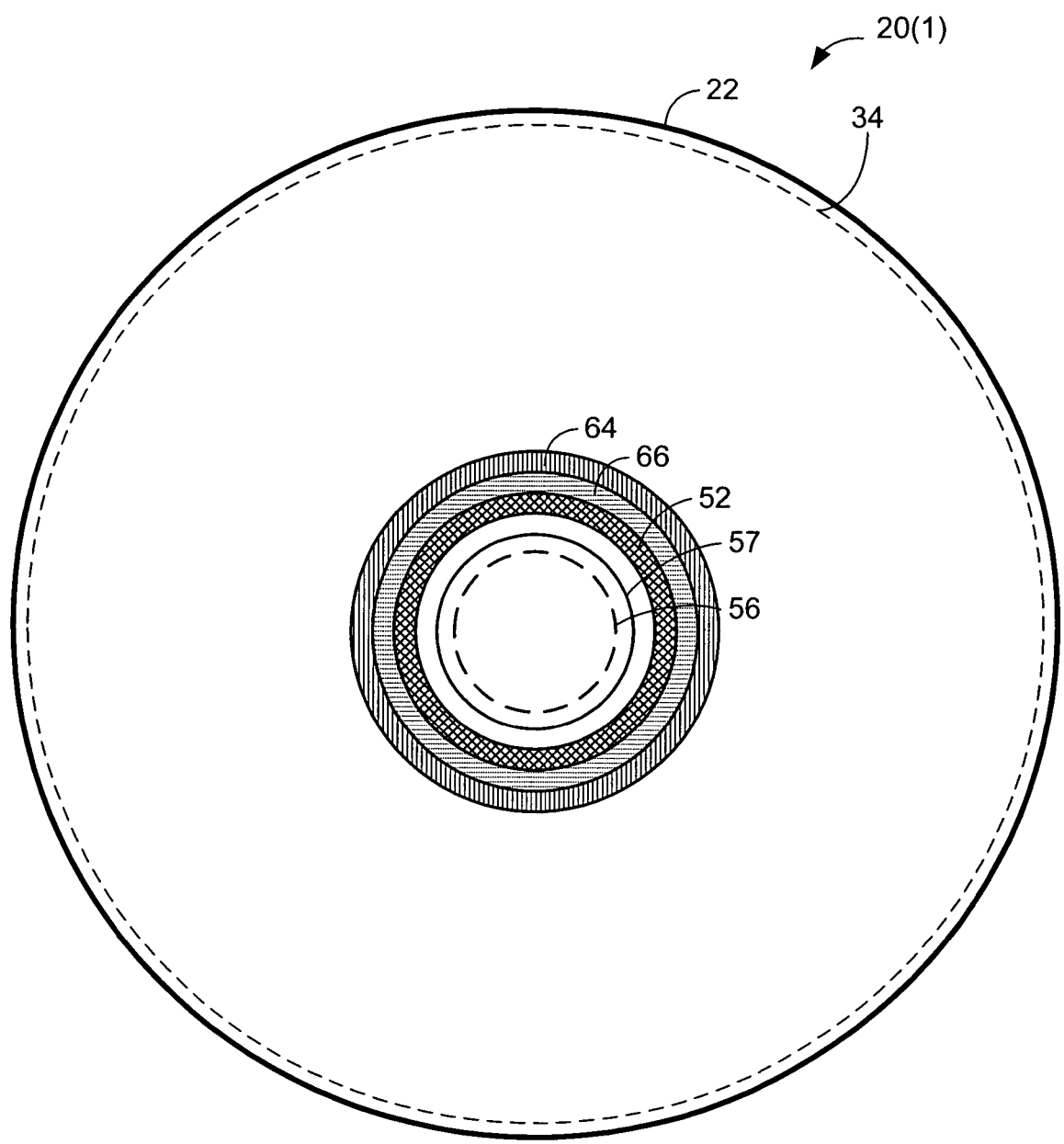
FIG. 2 is a front view of the pump of FIG. 1A taken along line 2-2.

FIG. 1A, FIG. 1B, and FIG. 1C, together with FIG. 2, illustrate a pump 20(1) according to a first example implementation of a first example embodiment. As with other implementations and embodiments described herein, pump 20(1) has a diaphragm assembly comprising two diaphragms, i.e., diaphragm 22 and diaphragm 24, which have their respective edges or peripheries at least partially bonded together to form a bellows chamber 26 between the diaphragm 22 and diaphragm 24. For example, in the first embodiment the first diaphragm 22 has its edge 28 bonded to edge 30 of second diaphragm 24, so that the first diaphragm 22 and the second diaphragm 24 are bonded together essentially entirely around their peripheries.

The bonding of diaphragm 22 and diaphragm 24 can be realized in various ways. For example, a sealing gasket 32 may be inserted between edge 28 of diaphragm 22 and edge 30 of diaphragm 24, and an epoxy 34 or other adhesive or sealant applied externally over edge 28, edge 30, and sealing gasket 32. In the first embodiment, the sealing gasket 32 and epoxy 34 reside essentially completely around the edges of the diaphragm 22 and diaphragm 24.

In the particular implementations and examples illustrated herein, both diaphragm 22 and diaphragm 24 are essentially circular shaped diaphragms having an axial direction 36 and a longitudinal or diameter direction 38. While circular, oval, or elliptical shaped diaphragms are currently preferred, other shapes of diaphragms are also possible.

At least one and preferably both of the first diaphragm 22 and the second diaphragm 24 are piezoelectric diaphragms which displace in accordance with application of an electrical signal. As an example, each of first diaphragm 22 and second diaphragm 24 can be a multi-layered laminate which comprises a piezoelectric wafer which is laminated to/between one or more ruggedizing layers (e.g., metal layers), e.g., laminated by an adhesive between a metallic substrate layer and an outer metal layer. Structures of the multi-layered laminate which serve as the diaphragms, and processes for fabricating the same, are described in one or more of the following (all of which are incorporated herein by reference in their entirety): PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same". An unillustrated driver applies the electrical signal to whichever (or both) of the first diaphragm 22 and the second diaphragm 24 is the piezoelectric diaphragm.

The first diaphragm and the second diaphragm bow outwardly together and shrink in diameter during a suction stroke (e.g., intake stroke) but flatten out and increase in diameter during a pump stroke (e.g., exhaust stroke). FIG. 1A shows the pump 20(1) as an electrical signal is being applied to move the diaphragm assembly from the full pump stroke to the full suction stroke. FIG. 1B shows the pump 20(1) with the diaphragm assembly at the full suction stroke; FIG. 1C shows the pump 20(1) with the diaphragm assembly at the full pump stroke.

In a first example embodiment, an inlet port 42 is formed as a hole or opening in a central region of the first diaphragm 22 and an outlet port 44 is formed as a hole or opening in a central region of the second diaphragm 24. In this first embodiment, the first diaphragm 22 and the second diaphragm 24 are essentially entirely bonded together around their peripheries, and the bellows chamber 26 forms and serves as a pumping chamber. Fluid is admitted into the pumping chamber through the inlet port 42 and expelled from the pumping chamber through the outlet port 44.

In an example implementation of the first embodiment, an inlet valve 52 is provided at the inlet port 42 and an outlet valve 54 is provided at the outlet port 44. The inlet valve 52 is bonded or secured to diaphragm 22 at inlet port 42; the outlet valve 54 is bonded or secured to diaphragm 24 at outlet port 44. The inlet valve 52 has an inlet valve seat 56 which is carried by the first diaphragm 22, so that valve element 57 of the inlet valve 52 is driven closed on a suction stroke of the pump (see FIG. 1B) but is driven open on a pump stroke (see FIG. 1C). The outlet valve 54 has an outlet valve seat 58 which is carried by the second diaphragm 24 so that valve element 59 the outlet valve 54 is driven open during the suction stroke (see FIG. 1B) but driven closed on the pump stroke (see FIG. 1C). The inlet valve 52 and outlet valve 54 can be, e.g., simple check valves or other valves known to the person skilled in the art. The valve seats 56, 58 thus are rigidly fixed to the diaphragms 22, 24 in such a way that the motion of the diaphragms complements the action of the valves. In other words, instead of the valves operating passively purely under the influence of the moving fluid, the valve seats 56, 58 are now driven toward the valving elements 57, 59, respectively under the power of the diaphragms at the same time that the valving elements 57, 59 are being driven toward the seats 56, 58 by the fluid.

Fluid is applied to inlet port 42 through an unillustrated tube or the like which connects to the non-seat side of inlet valve 52. Similarly, fluid is discharged from outlet port 44 through an unillustrated tube which connects to the seat side of outlet valve 54.

In the first example embodiment, the driver applies the electrical signal to whichever of the first diaphragm and the second diaphragm is the piezoelectric diaphragm (or to both the first diaphragm and the second diaphragm when both are piezoelectric diaphragms) for causing the first diaphragm and the second diaphragm to bow outwardly together and thereby shrink in diameter for sucking the fluid into the bellows chamber, and for causing the first diaphragm and the second diaphragm to flatten out and increase in diameter for expelling the fluid from the bellows chamber.

In the example implementation of FIG. 1A, FIG. 1B, and FIG. 1C, a stationary pump holder 60 serves to suspend the pump so that neither the first diaphragm 22 nor the second diaphragm 24 contacts any diaphragm-restraining stationary structure and so that both the inlet valve 42 and outlet valve 44 are unconstrained active valves. In the particular illustration, stationary pump holder 60 comprises a vertical holder stand 62 which securely carries a horizontal sleeve 64. An essentially frictionless bushing 66 retains inlet valve 52 in horizontal sleeve 64 in a manner so that inlet valve 52 is translatable along the direction of axis 36 and yet retained to stand 62. Since motion of outlet valve 54 is not restrained along axis 36 during the strokes of the diaphragm assembly, neither is second diaphragm 24. By having inlet valve 52 translatable, no, or at best only minimal, restraint is applied to first diaphragm 22. Therefore, both diaphragm 22 and diaphragm 24 are able to move relatively freely.

Figure 3:
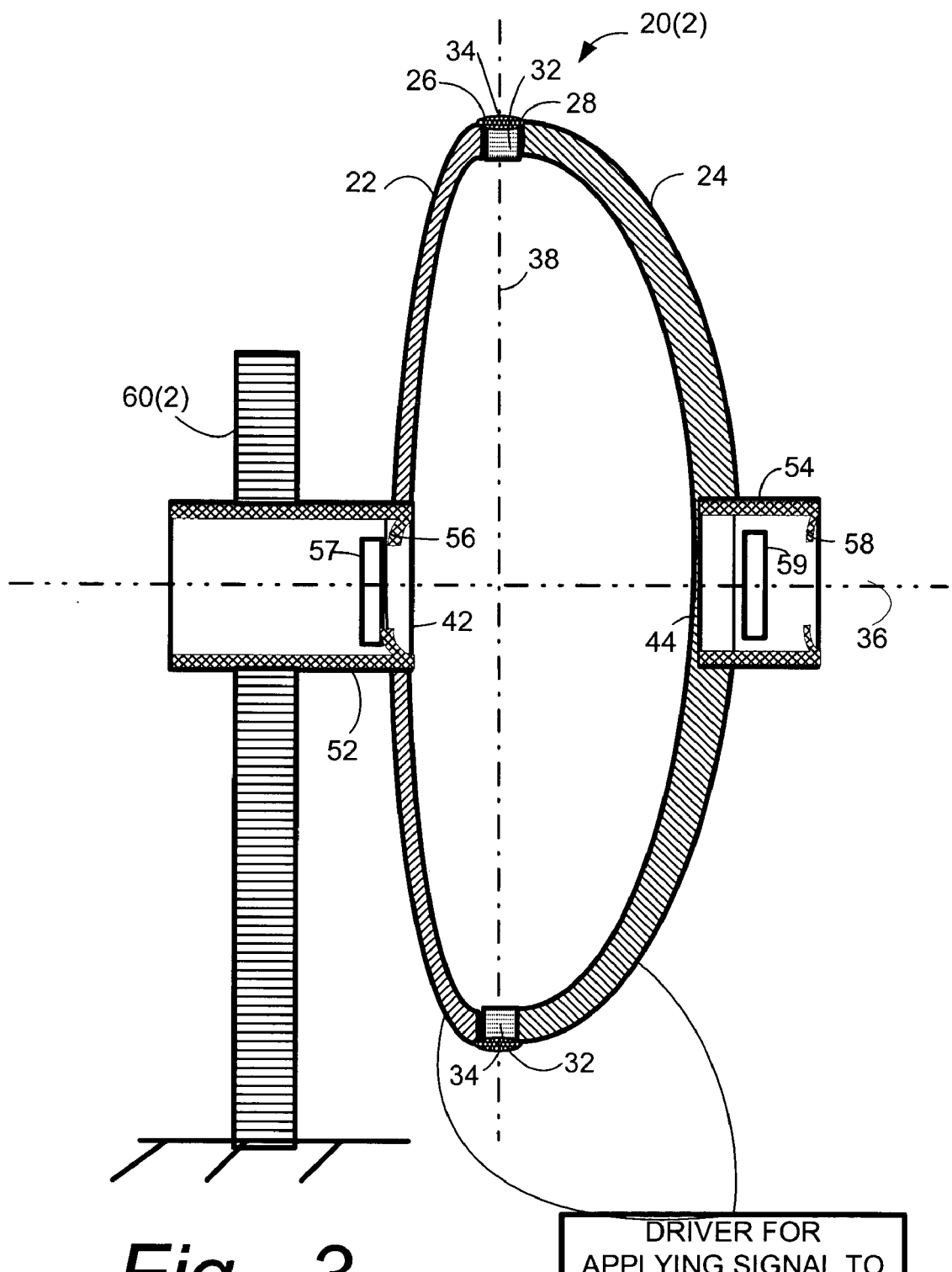
FIG. 3 is a cross sectioned side view of a pump according to a second example implementation of the first embodiment, the pump being mounted so that one diaphragm thereof has free movement and one valve thereof is active, the pump being at a point of operation intermediate a full suction stroke and a full pump stroke.

FIG. 3 shows a pump 20(2) according to a second example implementation of the first embodiment. The pump 20(2) differs from pump 20(1) of the first example implementation in that pump 20(2) is mounted so that one diaphragm, i.e., diaphragm 24, thereof has free movement and one valve thereof (outlet valve 54) is active. The first diaphragm 22 of pump 20(2) is at least partially constrained in that the inlet valve 52, carried by diaphragm 22, is held stationary by pump holder 60(2). As in other embodiments and implementations, it will be understood that fluid is applied to inlet port 42 through an unillustrated tube or the like which connects to the non-seat side of inlet valve 52. Similarly, fluid is discharged from outlet port 44 through an unillustrated tube which connects to the seat side of outlet valve 54. Even in such an implementation in which one of the two diaphragms is mounted rigidly and the other diaphragm is allowed to move freely, there is still one valve which is active (e.g., outlet valve 54 in FIG. 3), which provides some benefit.

FIG. 3 shows pump 20(2) as being at a full suction stroke. Since first diaphragm 22 of this second implementation of the first embodiment is somewhat restrained by the mounting of pump 20(2), diaphragm 22 is considered a "passive valve" since it is not as active and thus not as deflected during the full suction stroke as compared to the first implementation (see FIG. 1B). On the other hand, second diaphragm 24 is twice as active, and thus shown with even greater deflection than in the first implementation.

In the FIG. 3 implementation the inlet valve 52 serves as a stationary mounting valve for pump 20(2). It will be appreciated that either the inlet valve 52 or the outlet valve 54 can serve as the stationary mounting valve. When the inlet valve 52 is the stationary mounting valve, first diaphragm 22 is passive and does not contact any stationary structure except the mounting valve 52; second diaphragm 24 does not contact any stationary structure at all and is active. Conversely, when outlet valve 54 is the stationary mounting valve, second diaphragm 24 is passive and does not contact any stationary structure except the mounting valve 54; first diaphragm 22 is active and does not contact any stationary structure at all. Here it is assumed, of course, that the tubes, etc., connected to the free valve are sufficiently resilient or have sufficient play so as to provide essentially no constraining influence on the active diaphragm which carries the valve.

Thus, the inlet valves and active valves can be either active or passive in accordance with differing embodiments and configurations of mounting of the pump. While active valves may afford some advantages in some configurations and circumstances, active valves are not required nor essential and thus the embodiments described herein should not be limited by inclusion or not of active valves.

Figure 4:
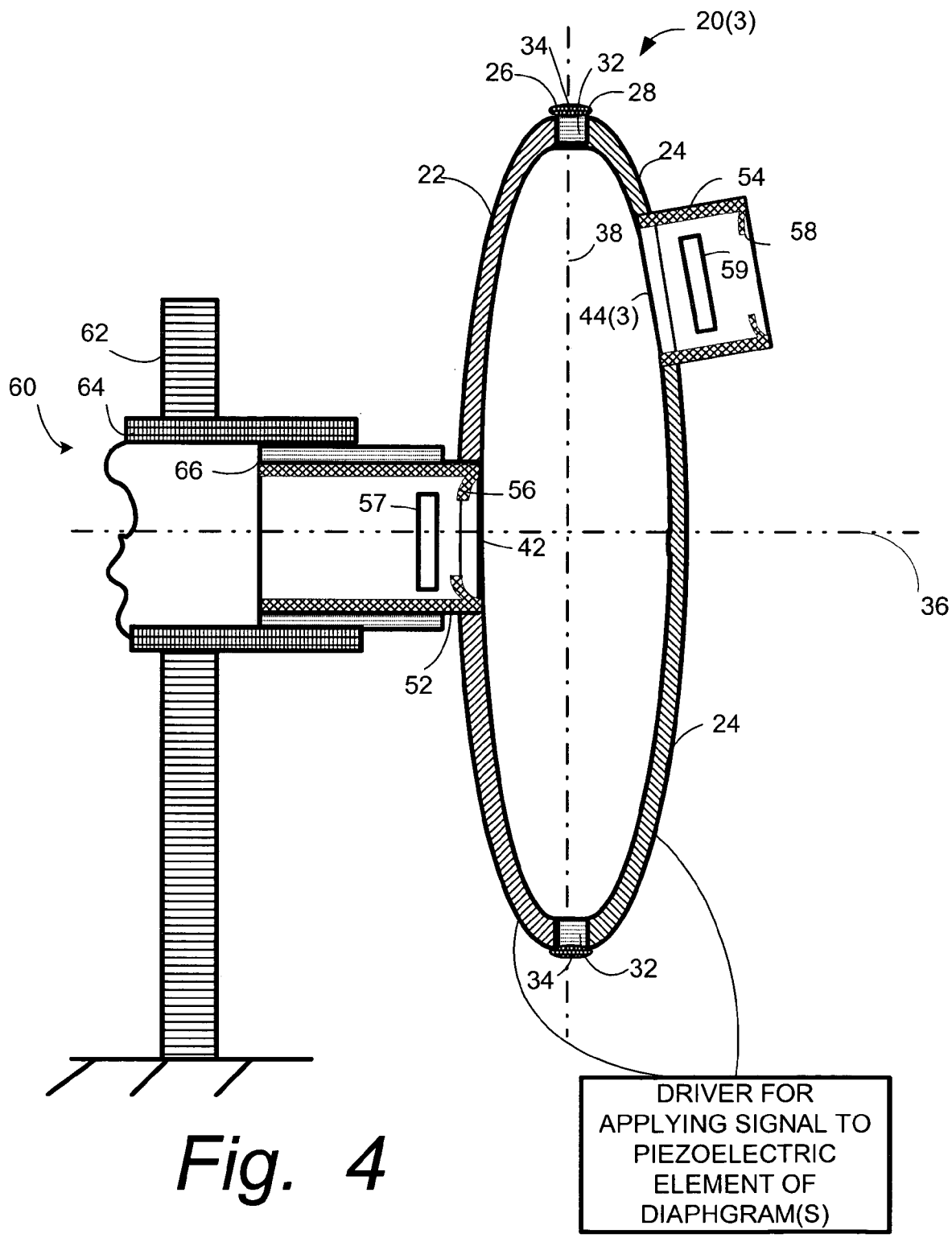
FIG. 4 is a cross sectioned side view of a pump according to a third example implementation of the first embodiment, the pump having non-aligned ports.

FIG. 4 shows a pump 20(3) according to a third example implementation of the first embodiment. The pump 20(2) of FIG. 4 differs from the first example implementation of the first embodiment by having non-aligned ports. Specifically, inlet port 42 and outlet port 44(3) of pump 20(2) are not aligned but instead are axially offset with respect to the axial direction 36. Whereas inlet port 42 is centrally located with respect to the axial direction 36 and diaphragm 22, outlet valve 54 is offset from axial direction 36 and is more proximate the edge 30 of diaphragm 24. It will be appreciated that other non-aligned configurations are also possible. For example, inlet port 42 rather than outlet port 44 may be off-axis (e.g., off the axis 36); both inlet port 42 and outlet port 44 may be off-axis with respect to the centers of diaphragm 22 and 24 and yet relatively aligned; one of the ports may be located proximate a top edge of the diaphragm assembly while the other of the ports may be located proximate a bottom edge of the diaphragm assembly; and so forth.

Figure 5:
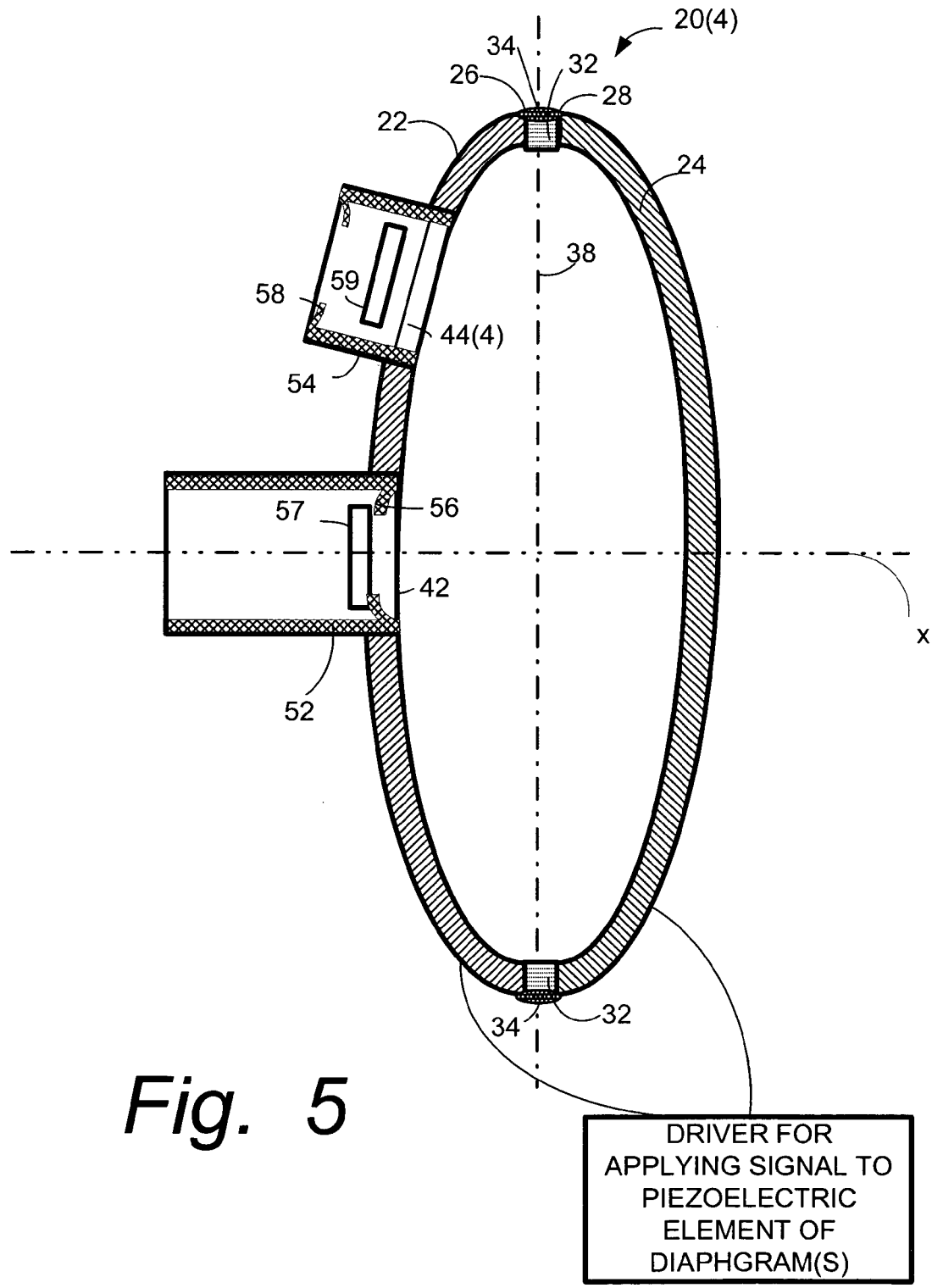
FIG. 5 is a cross sectioned side view of a pump according to a fourth example implementation of the first embodiment, the pump having both an inlet port and an outlet port on a same diaphragm.

FIG. 5 shows a pump 20(4) according to a fourth example implementation of the first embodiment. The pump 20(4) has both inlet port 42 and outlet port 44(4) on a same diaphragm, e.g., first diaphragm 22. It should be appreciated that conversely both the inlet port and outlet port can be formed instead on diaphragm 24. The implementation of FIG. 5 resembles the implementation of FIG. 1A in that both diaphragm 22 and diaphragm 24 are active (although no stationary pump holder such as stationary pump holder 60 is shown in FIG. 5). In other implementations in which both the inlet port with its inlet valve and the outlet port with its outlet valve are formed on the same diaphragm, and if either of the diaphragms is to be passive, preferably the diaphragm which does not carry the two valves will be the passive diaphragm. For example, if one of the diaphragms of the FIG. 5 implementation is to be passive, it should be the second diaphragm 24 since diaphragm 24 carries no ports or valves.

Figure 6A:
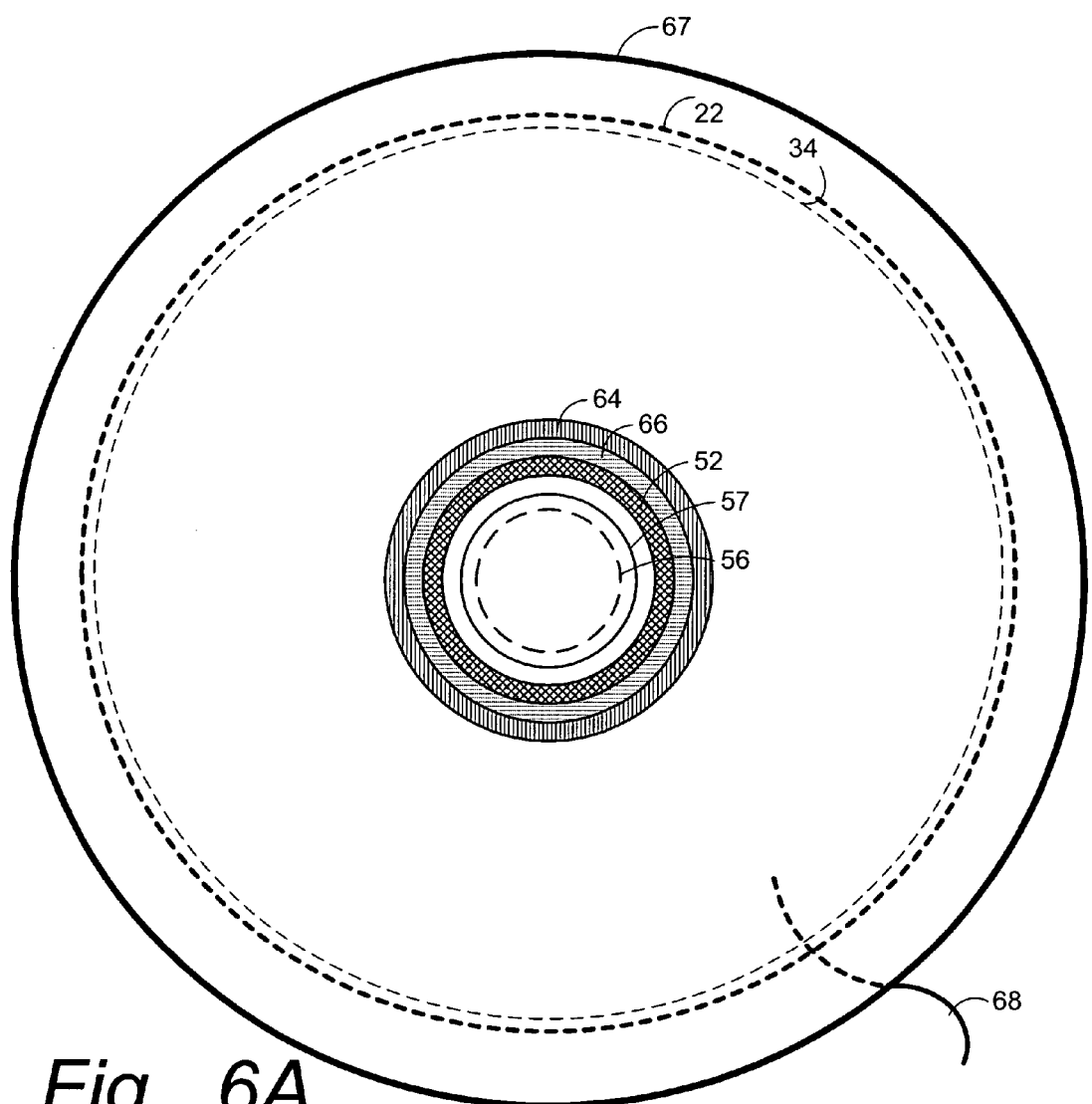
FIG. 6A is a front view of portions of a pump of the first embodiment showing sealing of the bellows chamber by sandwiching the diaphragms between two laminated layers.
Figure 6B:
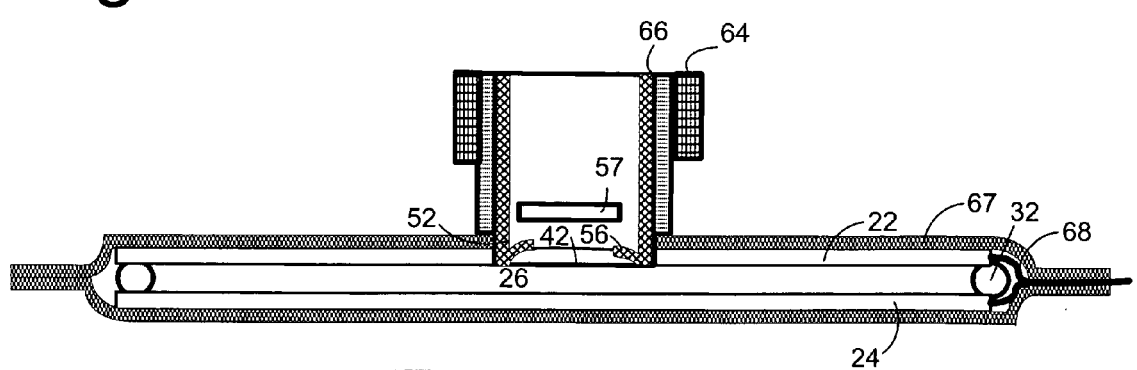
FIG. 6B is a side view of the pump of FIG. 6A.

FIG. 6A and FIG. 6B show how a pump of the first embodiment can be fabricated by sealing of the bellows chamber 26 by means other than an epoxy bead formed around the periphery of the diaphragm 22 and the diaphragm 24. In particular, FIG. 6A and FIG. 6B show sealing by the sandwiching of diaphragm 22 and diaphragm 24 between two lamination layers 67. In the fabrication method, the sealing gasket 32 is positioned between the diaphragm 22 and diaphragm 24 at their edges, and two sheets of lamination layers 67 used to envelope the diaphragm assembly thusly constructed. The peripheries of the lamination layers 67 extend beyond the edges of the diaphragm 22 and diaphragm 24 and form a lamination zone. The electrical leads 68 which are connected to the diaphragms which are electrically active (e.g., piezoelectric diaphragms) extend radially from the diaphragm assembly and through the lamination zone and are also at least partially sandwiched by the lamination layers 67. The two lamination layers 67 are then heated or otherwise treated to form the lamination, resulting in an overall laminated pump assembly.

As an alternative to provision of separate sandwiching lamination layers, a suitable laminatable layer of each of the two diaphragms 22, 24 can be formed as oversized, and the two oversized layers lamination together in a zone or region which extends beyond the edges of the two diaphragms 22, 24. For example, in an embodiment in which the diaphragms comprise a polyamide layer, the polyamide layer can be formed to have a larger diameter than the remaining layers of the two diaphragms 22, 24, and then the two polyamide layers bonded or laminated together. In such alternate fabrication, the electrical leads 68 can also be laminated similar to the manner illustrated in FIG. 6A and FIG. 6B.

In pumps according to implementations of a second example embodiment, diaphragms are again bonded to form a bellows chamber. But unlike the first embodiment wherein the bellows chamber also served as the pumping chamber, in the second embodiment the bellows chamber is auxiliary to a separately provided pumping chamber. In particular, the bellows chamber is auxiliary to and communicates with a working chamber defined by a housing. In the second example embodiment, the working chamber is the pumping chamber; in a third example embodiment the pumping chamber is located at least partially within the working chamber. In both the second embodiment and the third embodiment, an opening or aperture is provided in the diaphragm assembly to permit communication with the housing that either defines or encloses the pumping chamber.

Figure 7:
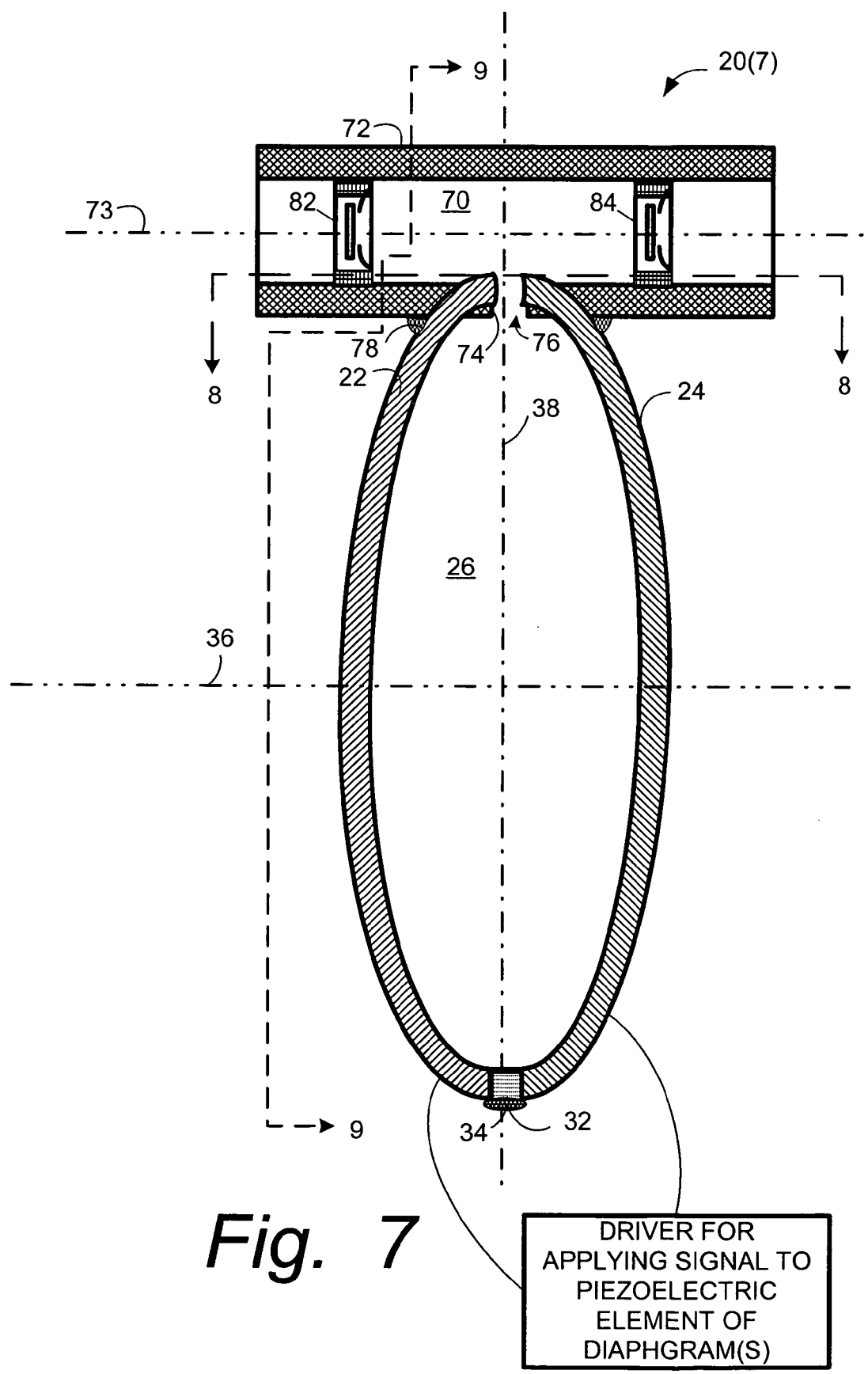
FIG. 7 is a cross sectioned side view of a pump according to a first example implementation of a second example embodiment, the pump having diaphragms bonded to form a bellows chamber which communicates with a separate pumping chamber, the bellows chamber being essentially transverse to the pumping chamber.
Figure 8:
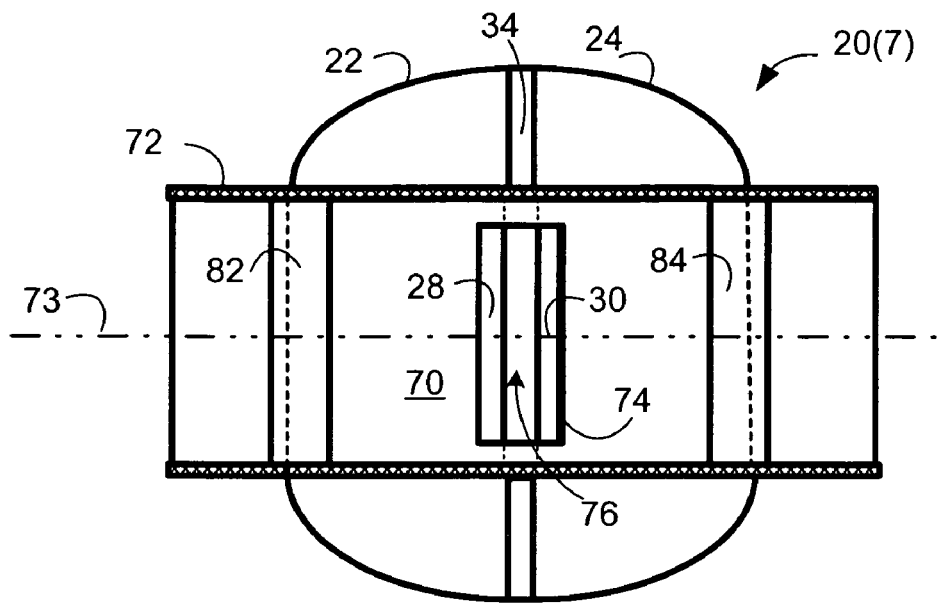
FIG. 8 is a sectioned top view of the pump of FIG. 7 taken along line 8-8.
Figures 9, 12:
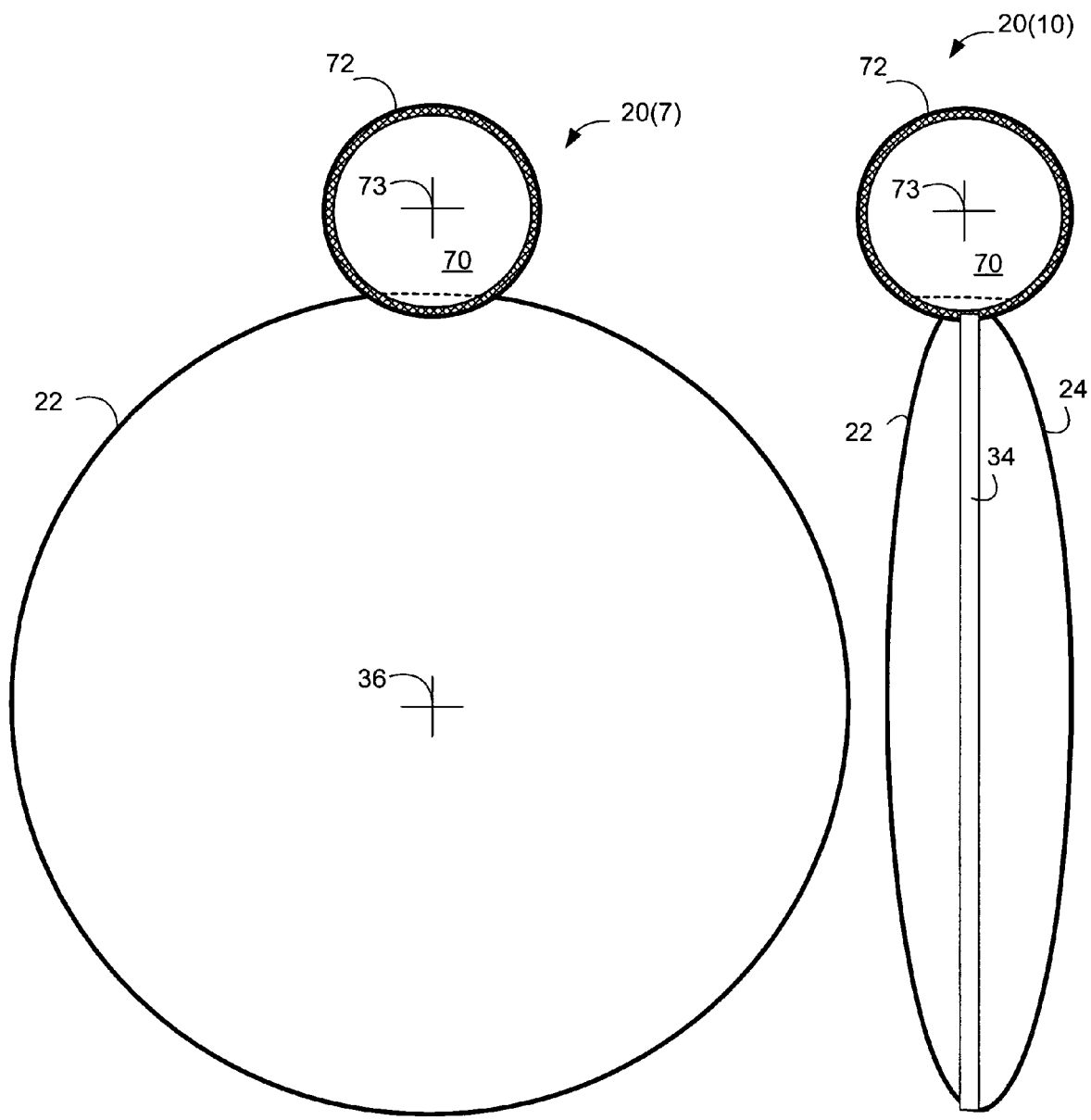
FIG. 9 is a section front view of the pump of FIG. 7 taken along line 9-9.
FIG. 12 is a section front view of the pump of FIG. 10 taken along line 12-12.

FIG. 7, FIG. 8, and FIG. 9 show a pump 20(7) according to a second example embodiment. The pump 20(7) has diaphragm 22 and diaphragm 24 bonded to form bellows chamber 26. The bellows chamber 26 is auxiliary to and communicates with a separate pumping chamber 70. The pumping chamber 70 is defined by a chamber housing 72 positioned above the diaphragm assembly. In the illustrated implementation, chamber housing 72 takes the form of a cylindrical tube which has a central axis 73. Other shapes and configurations for chamber housing 72 are possible.

In one example mode of fabrication, communication between bellows chamber 26 and pumping chamber 70 is facilitated by an aperture or slit 74 formed or provided in and through the bottom wall of chamber housing 72, as well as an opening or aperture 76 formed in the bonding interface of first diaphragm 22 and second diaphragm 24. In one illustrated implementation with a cylindrical chamber housing 72, the slit 74 is provided transverse to central axis 73 and at the bottom of the chamber housing 72 (see FIG. 7, FIG. 8, and FIG. 9). The communication aperture 76 of the diaphragm assembly may be realized by omitting or removing the sealing gasket 32 and epoxy 34 at the crown (or other appropriate location) along the edge 28 and edge 30 of the diaphragm 22 and diaphragm 24, respectively. The length of the omission or removal of the sealing gasket 32 and epoxy 34 is on the order of the length of the slit 74 provided on the underside of chamber housing 72. Preferably a region of the upper portion of the diaphragm assembly which bears the communication aperture 76 is inserted into housing slit 74 so that a small tangential portion of edge 28 of first diaphragm 22 and a small tangential portion of edge 30 of second diaphragm 24 protrude into or are flush with edges of housing slit 74, as shown in FIG. 8, thereby permitting communication, e.g., a pressure waveform through communication aperture 76 between bellows chamber 26 and pumping chamber 70. The diaphragm assembly can be secured to chamber housing 72 and the interface between communication aperture 76 and slit 74 sealed, if necessary, by an appropriate bonding or sealing medium 78, such as epoxy, for example.

Other modes of providing communication between bellows chamber 26 and pumping chamber 70 are also encompassed hereby. For example, a separate tube, passageway, or the like may connect bellows chamber 26 and pumping chamber 70, and may be positioned at locations other than at the bond of diaphragm 22 and diaphragm 24.

The pumping chamber 70 of pump 20(7) has both an inlet valve 82 and an outlet valve 84. For some implementations and applications the inlet valve 82 and outlet valve 84 may preferably be positioned in pumping chamber 70 close together in order to facilitate priming of pump 20(7) and performance. In other systems that do not require priming (e., laptop cooling applications), it may instead be beneficial to position the inlet and outlet valves away from the bellows, e.g., one or more valves somewhere in a cooling loop with one or more bellows at different points in the loop.

In pump 20(7), action of the diaphragm assembly, e.g., first diaphragm 22 and second diaphragm 24, generates a pressure waveform in the bellows chamber 26. The pressure waveform is communicated through aperture 76 and slit 74 and into pumping chamber 70 for selectively causing impulsion of the fluid through inlet valve 82 into the pumping chamber 70, and expulsion of the fluid through outlet valve 84 from the pumping chamber 70.

The chamber housing 72 of the second embodiment with its pumping chamber 70 can be stationary, with the first diaphragm 22 and the second diaphragm 24 being suspended from the pumping chamber and externally essentially unconstrained. Thus, in the second embodiment, both first diaphragm 22 and second diaphragm 24 are active.

Figure 11:
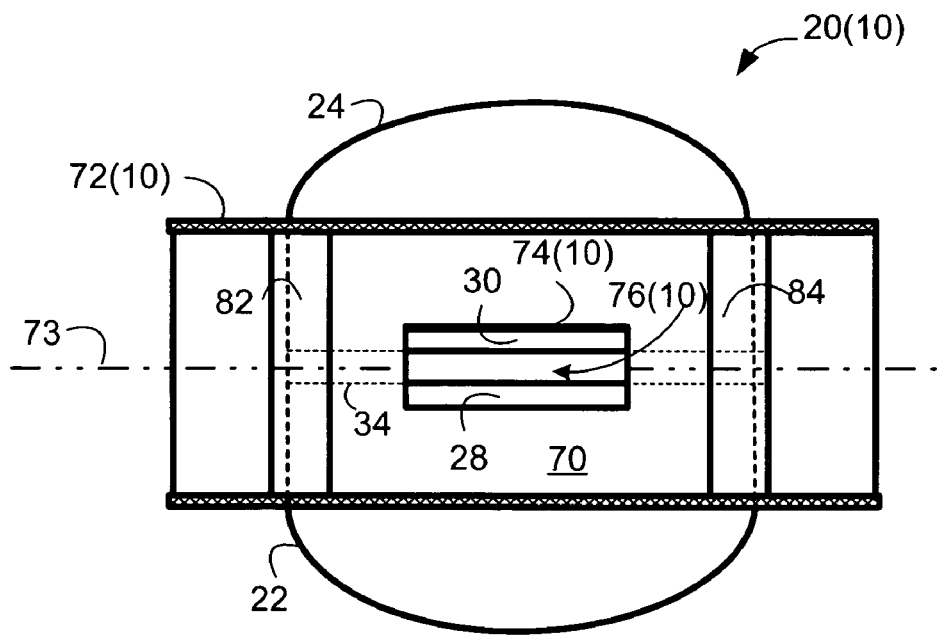
FIG. 11 is a sectioned top view of the pump of FIG. 10 taken along line 11-11.
Figure 10:
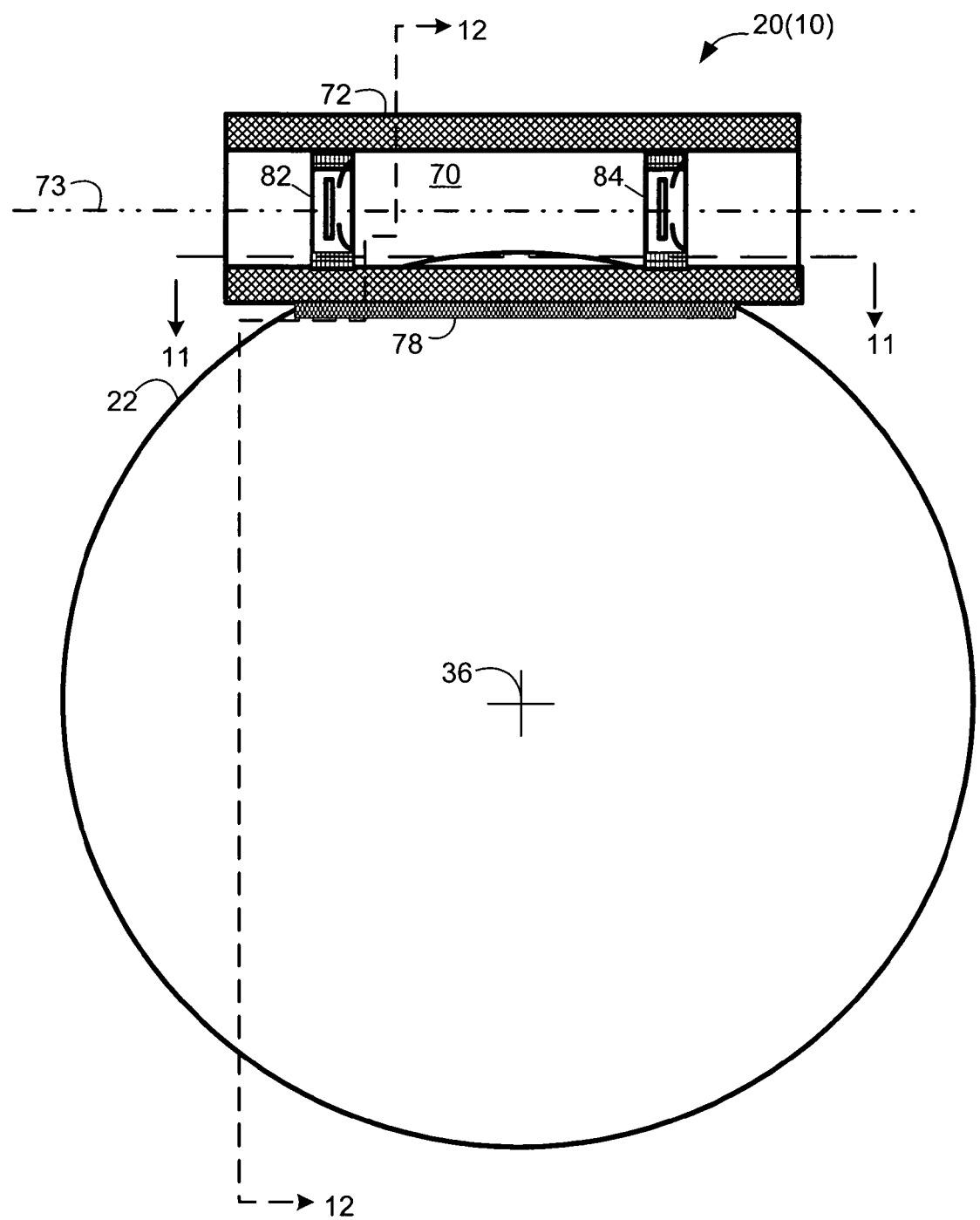
FIG. 10 is a cross sectioned side view of a pump according to a second example implementation of a second example embodiment, the pump having diaphragms bonded to form a bellows chamber which communicates with a separate pumping chamber, the bellows chamber being essentially parallel to the pumping chamber.

Whereas in the implementation of FIG. 7 the bellows chamber is essentially transverse to the pumping chamber, FIG. 10, FIG. 11, and FIG. 12 show another implementation of the second embodiment wherein the bellows chamber is essentially parallel to the pumping chamber. As such, the slit 74(10) in chamber housing 72(10) and the communication aperture 76(10) are both parallel rather than transverse to the major axis 73.

Figure 13:
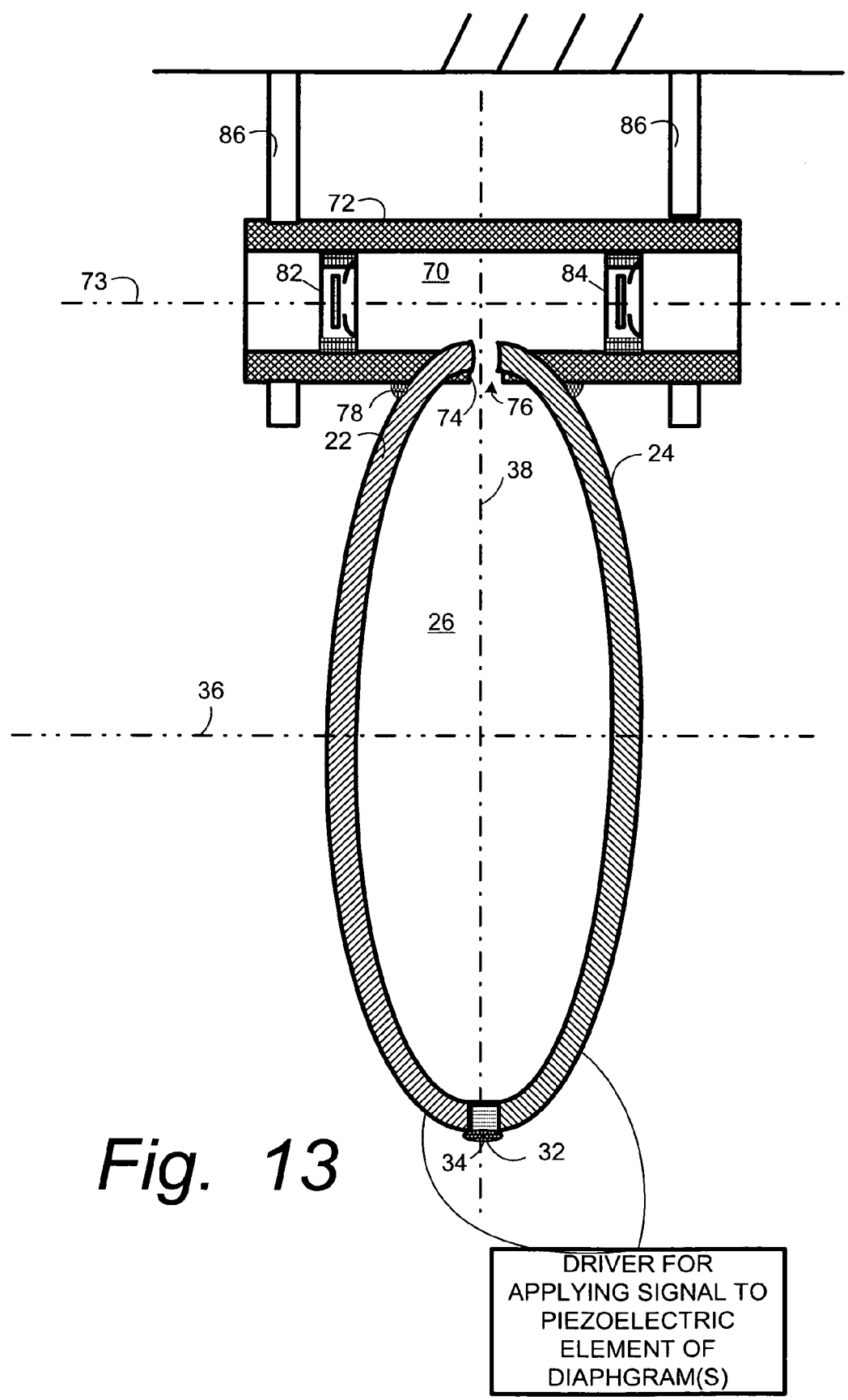
FIG. 13 is a cross sectioned side view of the pump of FIG. 7 being suspended or rigidly retained by a mounting structure.

FIG. 13 shows how a pump of the second embodiment, such as pump 20(7), can be suspended or rigidly retained by a mounting structure. In FIG. 13 the chamber housing 72 is securely retained by mounting brackets 86 so that chamber housing 72 is essentially stationary. The diaphragm assembly is suspended below chamber housing 72, so that both diaphragm 22 and diaphragm 24 of the diaphragm assembly are essentially unconstrained and thus active. The pump 20(10) of the second implementation of the second embodiment can be suspended or mounted in same or similar manner as depicted in FIG. 13.

Figure 14:
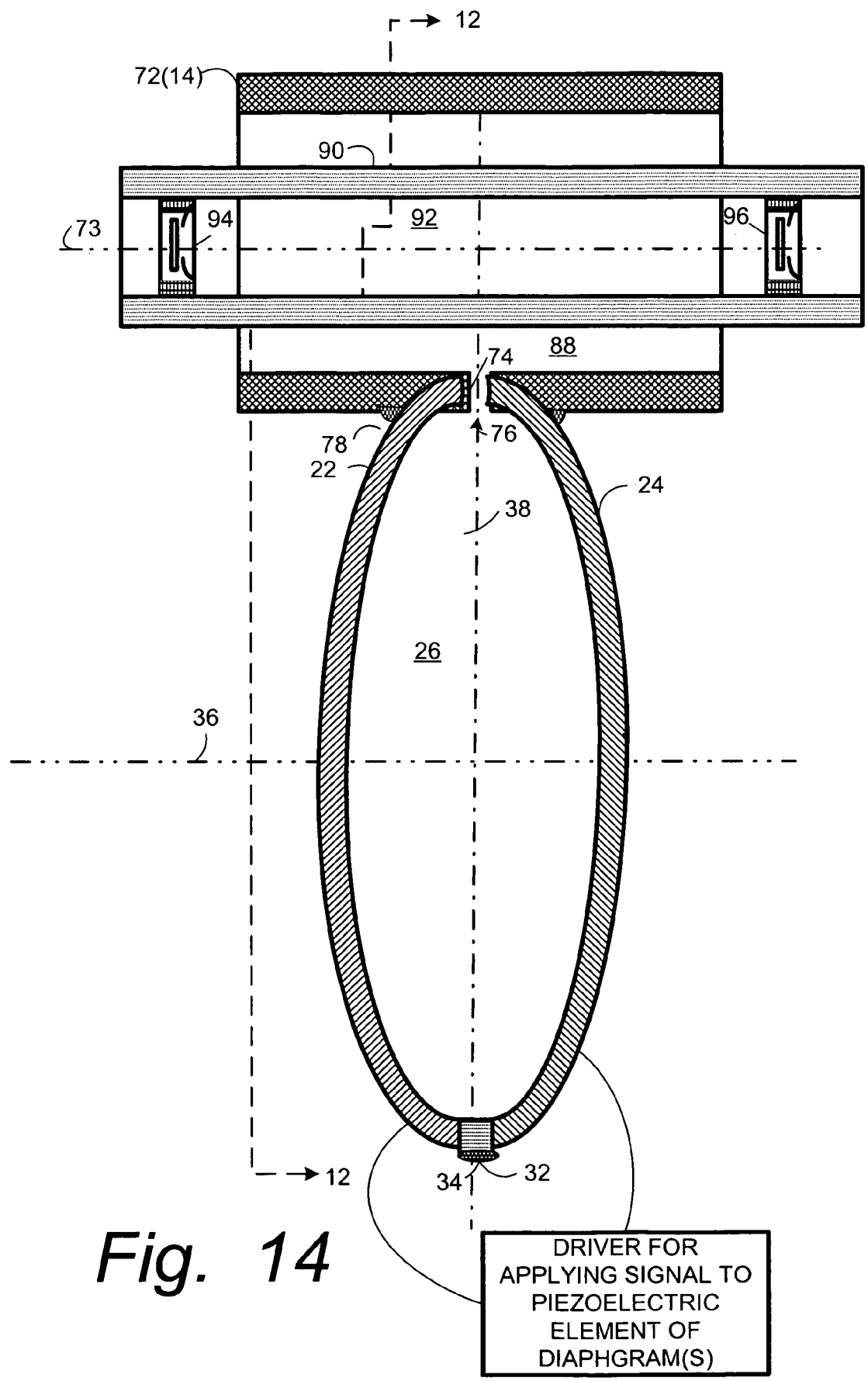
FIG. 14 is a cross sectioned side view of a pump according to a first example implementation of a third example embodiment, the pump having diaphragms bonded to form a bellows chamber which communicates with a separate pressure chamber through which a flexible member defining a pumping chamber extends.
Figure 15:
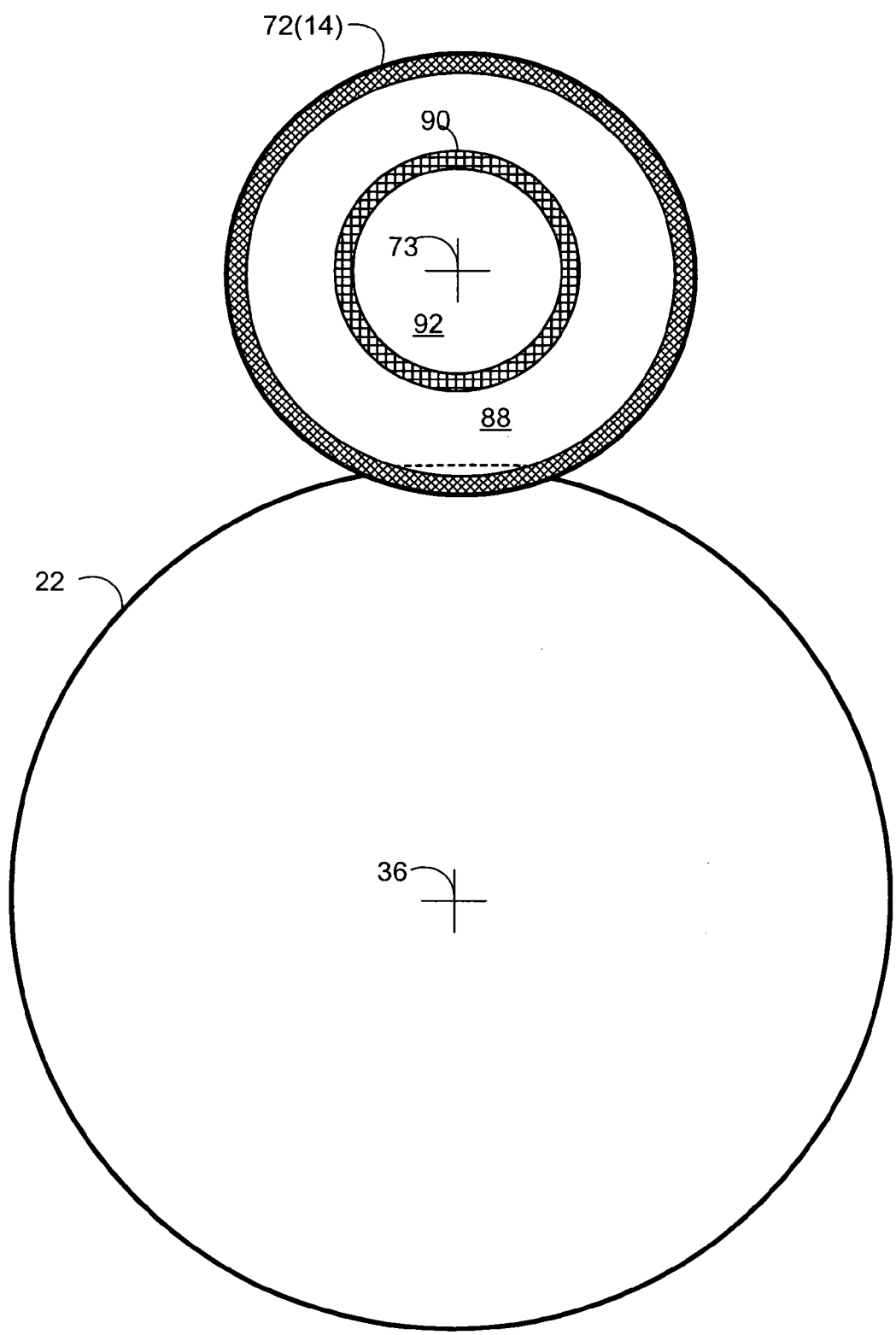
FIG. 15 is a section front view of the pump of FIG. 14 taken along line 12-12.

The third example embodiment is a variation of the second example embodiment. In the third example embodiment, illustrated in FIG. 14 and FIG. 15, pump 20(11) has diaphragm 22 and diaphragm 24 bonded to form a bellows chamber 26. Housing 72(14) defines a working chamber which serves as a pressure chamber 88. The housing 72(14) at least partially encloses a flexible member 90, e.g., a flexible tube or sack, which defines pumping chamber 92. At least a portion of the interior of the flexible member 90 serves as the pumping chamber 92. Thus, bellows chamber 26 communicates with a separate pressure chamber 83 through which flexible member 90 (defining pumping chamber 92) at least partially extends.

In the illustrated implementation, the flexible member 90 is cylindrical and concentrically positioned within chamber housing 72. The flexible member 90 may be held within chamber housing 72 by unillustrated radial spacers or the like. The concentric region within chamber housing 72 but outside of flexible member 90 defines pressure chamber 83. An inlet valve 94 and an outlet valve 96 are positioned internally within flexible member 90, with the pumping chamber 92 existing between inlet valve 94 and outlet valve 96. The flexible member 90 may take a shape and form other than a cylindrical tube.

Action of the first diaphragm 22 and the second diaphragm 24 generates a pressure waveform in the bellows chamber 26 and in the pressure chamber 88 for selectively causing impulsion of the fluid via inlet valve 94 into the pumping chamber 92 defined by flexible member 90, and expulsion of the fluid from pumping chamber 92 through outlet valve 96.

Figure 16A:
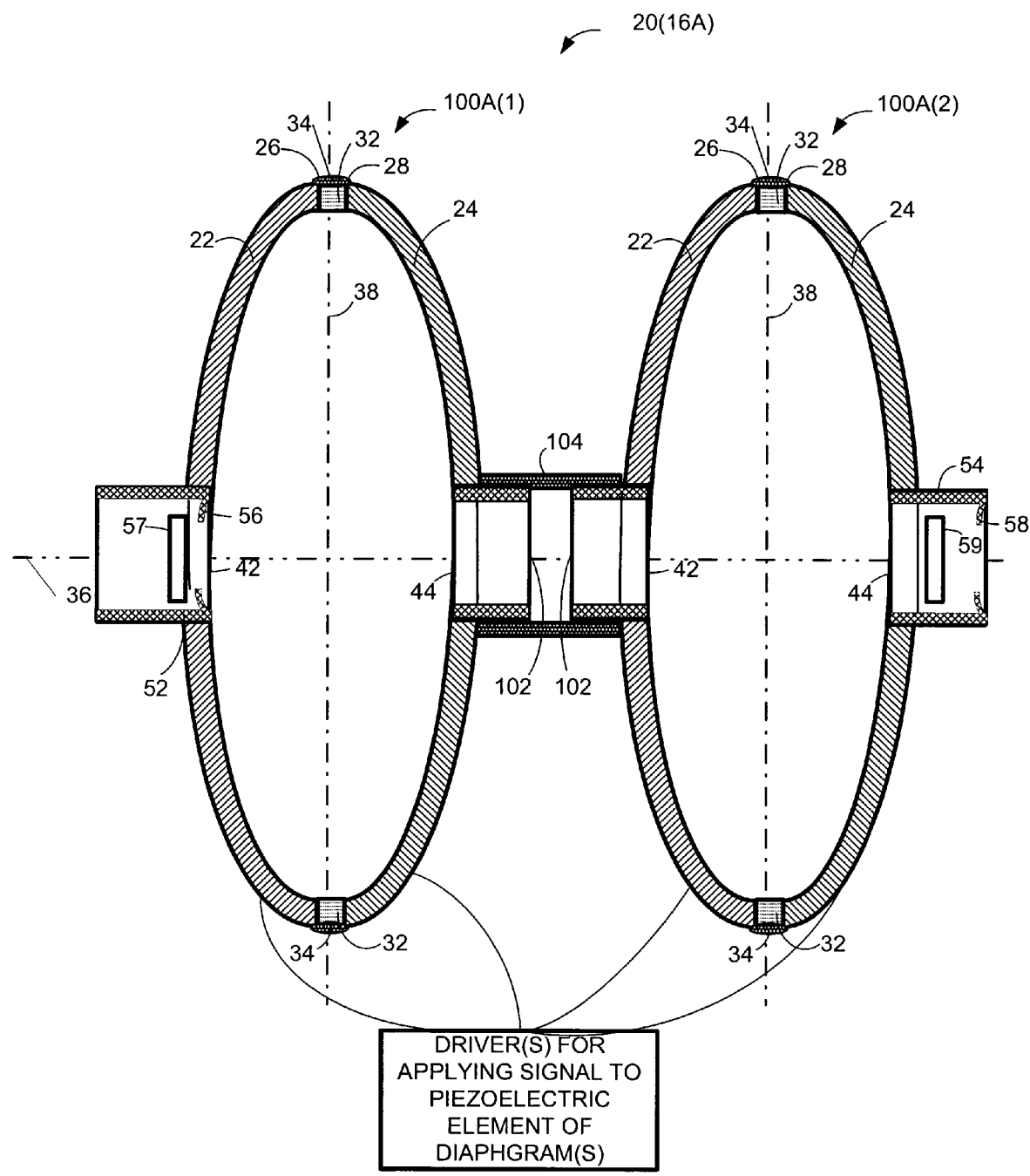
FIG. 16A is a cross sectioned side view of a pump of a first implementation of a fourth example embodiment, the pump comprising plural modular first embodiment pump sections directly cascaded together.

FIG. 16A shows a pump 20(16A) of a first implementation of a fourth example embodiment. Advantageously, pump 20(16A) comprises plural modular pump sections (e.g., pump components) cascaded together. Particularly shown in FIG. 16 are two example modular pump sections, i.e., modular pump section 100A(1) and modular pump section 100A(2). It will be appreciated that, while only two modular pump sections are presently illustrated, more than two modular pump sections may be similarly cascaded or connected together.

It so happens that each of the modular pump sections of FIG. 16 basically resembles the pump 20(1) of the first implementation of the first embodiment. Such resemblance includes each modular pump section 100 comprising a first diaphragm 22 having a first diaphragm edge 28; a second diaphragm 24 having a second diaphragm edge 30; the first diaphragm edge 28 and the second diaphragm edge 30 being bonded together so that a pumping chamber 26 is formed between the first diaphragm 22 and the second diaphragm 24. Moreover, in an example implementation, for each of the modular pump sections at least one of the first diaphragm and the second diaphragm is a piezoelectric diaphragm which displaces in accordance with application of an electrical signal.

The modular pump sections 100A differ from those of the first embodiment in that, depending on placement of the modular pump section 100A in the overall cascading scheme, the modular pump section 100A will have either one or no valves (rather than having two valves). For example, modular pump section 100A(1) has an inlet valve 52 at its inlet port 42, but at its outlet port 44 has only a port extension 102. Similarly, modular pump section 100A(2) has an outlet valve 54 at its outlet port 44, but at its inlet port 42 has only port extension 102. Had a third modular pump section been provided between modular pump section 100A(1) and modular pump section 100A(2), the inlet port and outlet port of such third modular pump section would both have port extensions and no valves.

Each modular pump section serves as a pump component. A connector sleeve 104 is provided for connecting either an outlet valve 54 to a port extension 102, or for connecting two port extensions 102 together.

While the modular pump sections have been described in terms of the first implementation of the first embodiment, it should be appreciated that the modular pump sections can take on characteristics of other aforedescribed implementations of the first embodiment.

Figure 16B:
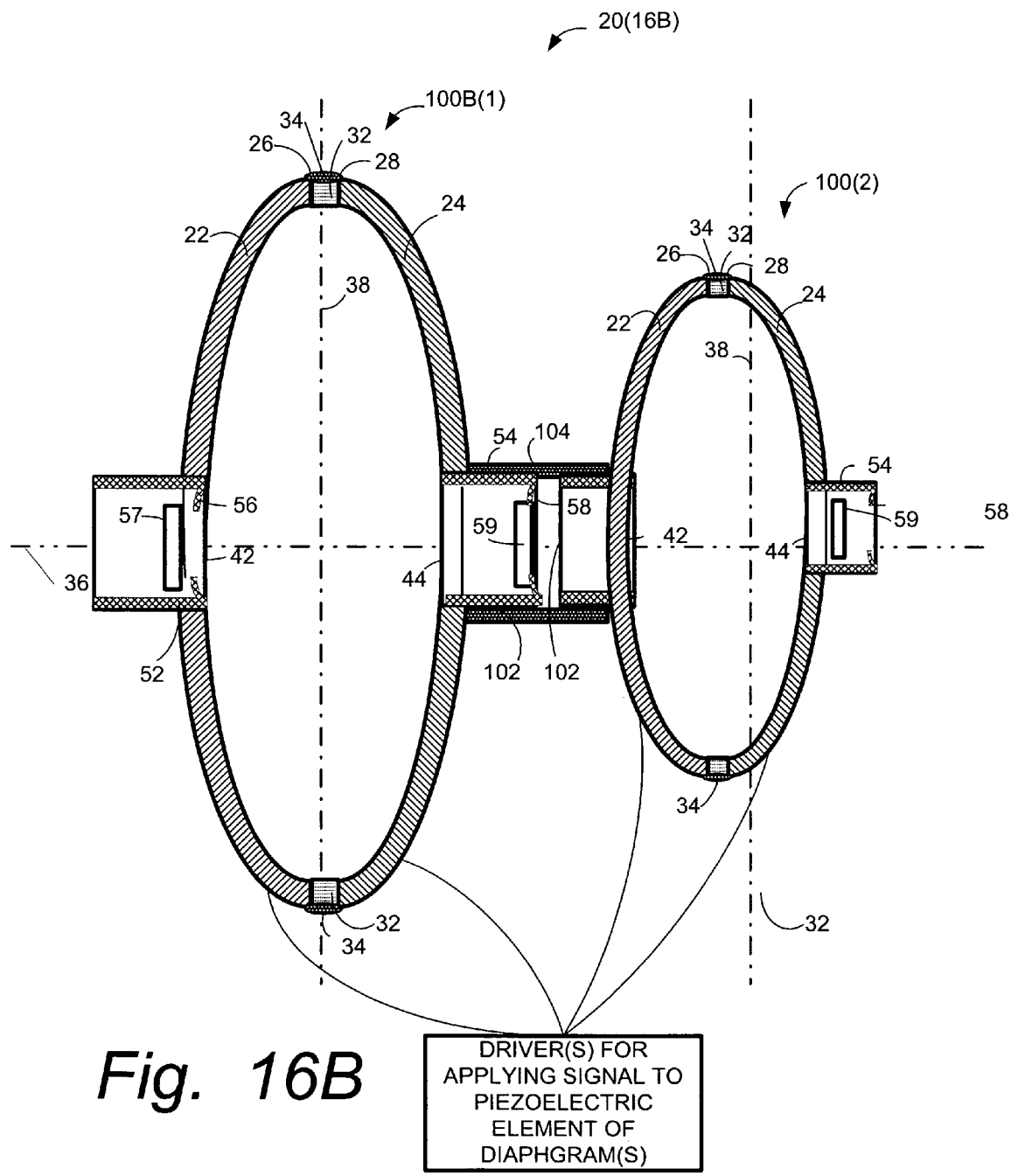
FIG. 16B is a cross sectioned side view of a high-pressure, high-volume pump comprising plural modular embodiment pump sections similar to those of FIG. 16A but cascaded with an intermediate valve positioned therebetween.

Whereas FIG. 16A shows plural modular pump sections 100A(1) and 100A (2) directly cascaded together, FIG. 16B shows a high-pressure, high-volume pump 20(16B) comprising plural modular embodiment pump sections 100B(1) and 100B(2) (which are similar to those of FIG. 16A) which are cascaded with an intermediate valve positioned therebetween. As such, the pump 20(16B) has at least one valve between its two bellows/pumping chambers 26. In the particular implementation shown in FIG. 16B, the pump section 100B(1) has an outlet valve 54 positioned at its outlet port 44. The connector 104 is employed, in similar manner as in the FIG. 16A embodiment, to couple first pump section 100B(1) to a port extension 102 of second pump section 100B(2). It should be understood that, alternatively, the intermediate valve between first pump section 100B(1) and second pump section 100B(2) may take the form of an inlet valve for second pump section 100B(2), or even another type of valve formed in the interior of connector 104 or the like.

The pump 20(16B) of FIG. 16B thus serves, for example, as a high-pressure, high volume pump, suitable for air (for example). Pump section 100B(1) has a large diameter, high-volume, lower force (e.g., lower pressure) bladder which is coupled to a smaller diameter (e.g., smaller volume), higher force (e.g., higher pressure) bladder for pump section 100B(2), thereby forming a two-stage compressor. The bladders of pump section 100B(1) and pump section 100B(2) can be electrically sequenced, with the larger bladder of pump section 100B(1) being a first stage of compression and thus actuated first, filling the smaller bladder of pump section 100B(2) with compressed air through the intermediate valve (e.g., outlet valve 54 of pump section 100B(1)). The smaller bladder of pump section 100B(2) then further compresses the air, delivering compressed air (or other fluid) at the high-pressure capability of the smaller bladder.

It will be further appreciated that the cascading of modular pumps sections of differing sizes/volume/pressures with an intermediate valve(s) for mimicking, e.g., high-volume, high-pressure, piston-type two stage compressors can be accomplished using pump sections other than the bellows-type pump sections herein disclosed, such as by using pump sections taught, for example, in PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", all of which are incorporated herein by reference.

Figure 17A:
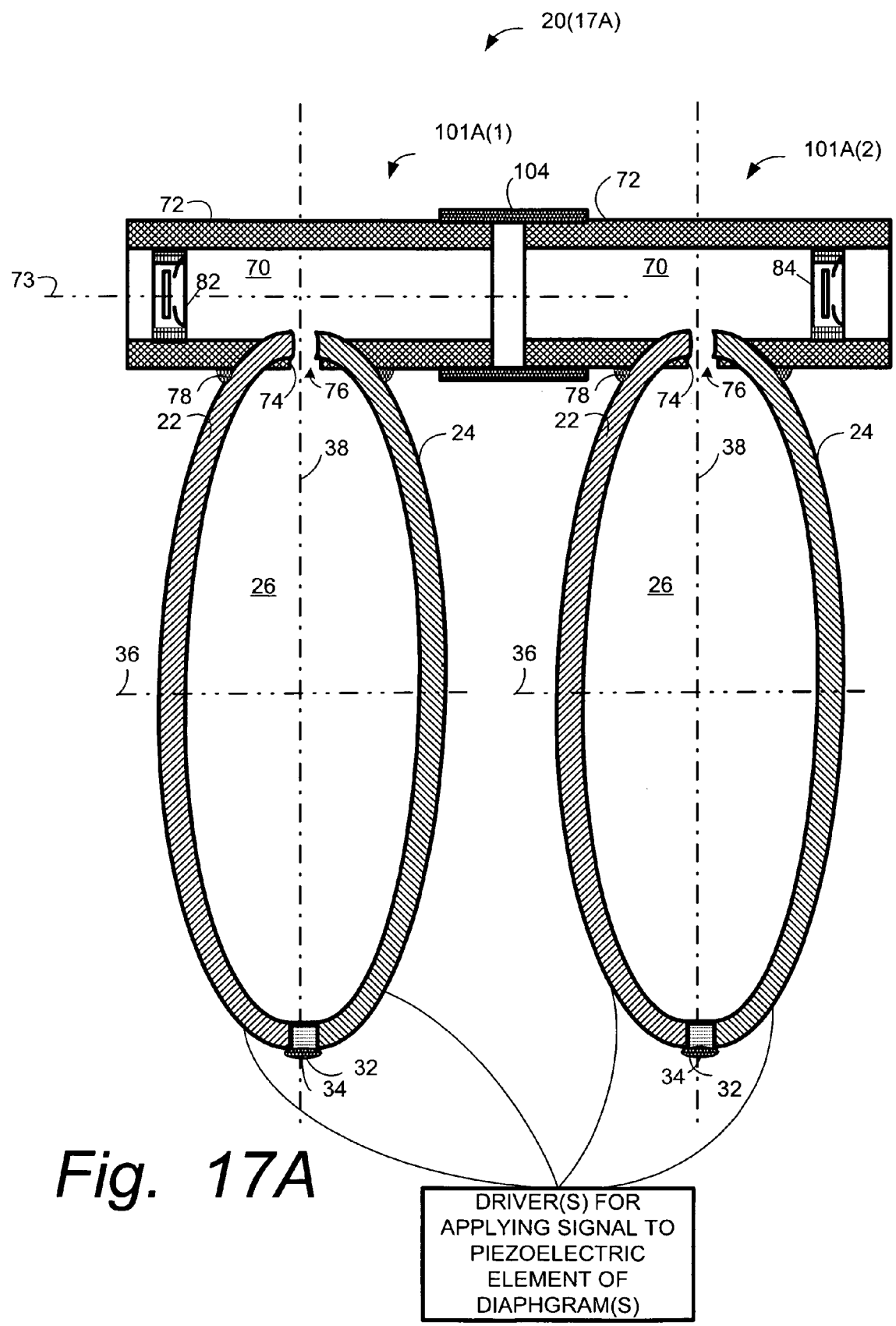
FIG. 17A is a cross sectioned side view of a pump of a second implementation of a fourth example embodiment, the pump comprising plural modular second or third embodiment pump sections cascaded directly together.

Similarly, modular pump sections can be constructed in accordance with other embodiments, such as the second embodiment and the third embodiment. In this regard, FIG. 17A illustrates pump 20(17A) as comprising plural modular pump sections cascaded together, i.e., modular pump section 101A(1) and modular pump section 101A(2), each of which are second embodiment pump sections. Again it will be appreciated that, while only two modular pump sections are presently illustrated, more than two modular pump sections may be similarly cascaded or connected together. The plural modular pump sections 101A can thus be cascaded directly together, with each modular pump section being connectable to another pump component via either the inlet port or the outlet port so that the section pumping chambers of the plural modular pump sections communicate to form a composite pumping chamber. The modular pump sections 101A differ from those of the second and third embodiments in that, depending on placement of the modular pump section 101A in the overall cascading scheme, the modular pump section 101A will have either one or no valves (rather than having two valves). For example, modular pump section 101A(1) has an inlet valve 82 at its inlet port, but has no valve at its outlet port. Similarly, modular pump section 101A(2) has an outlet valve 84 at its outlet port, but no valve at its inlet port. Had a third modular pump section been provided between modular pump section 101A(1) and modular pump section 101A(2), the inlet port and outlet port of such third modular pump section would have no valves. A connector sleeve 104 is provided for connecting the chamber housings 72 of the modular pump sections.

Figure 17B:
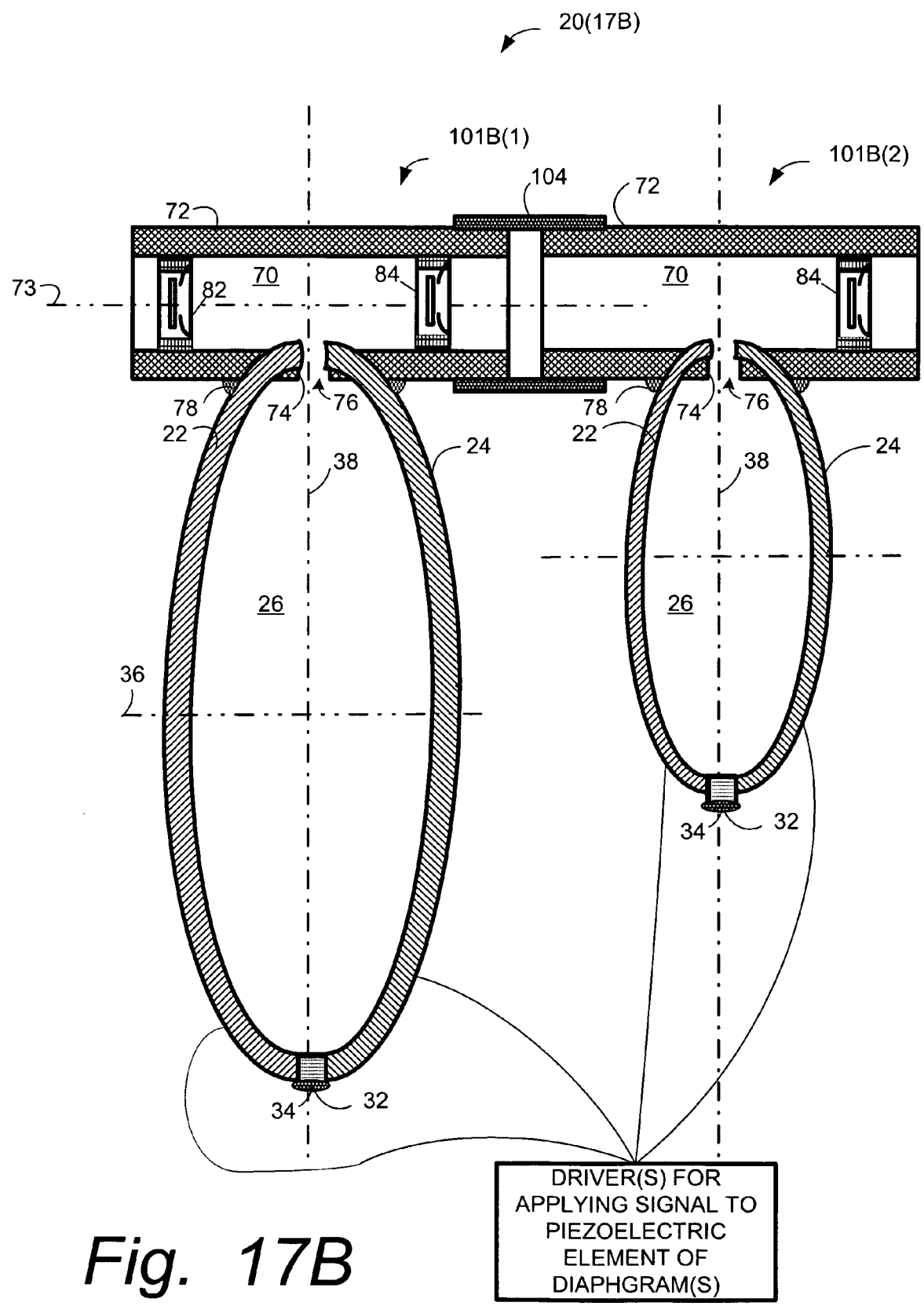
FIG. 17B is a cross sectioned side view of a high-pressure, high-volume pump comprising plural modular embodiment pump sections similar to those of FIG. 17A cascaded with an intermediate valve positioned therebetween.

Whereas FIG. 17A shows plural modular pump sections 101A(1) and 101A (2) directly cascaded together, FIG. 17B shows a high-pressure, high-volume pump 20(17B) comprising plural modular embodiment pump sections 101B(1) and 101B(2) (which are similar to those of FIG. 17A) which are cascaded with an intermediate valve positioned therebetween. As such, the pump 20(17B) has at least one valve between its two bellows/pumping chambers 26. In the particular implementation shown in FIG. 17B, the pump section 101B(1) has an outlet valve 84 positioned at its outlet port. The connector 104 is again employed, in similar manner as in the FIG. 17A embodiment, to couple first pump section 101B(1) to second pump section 101B(2). It should be understood that, alternatively, the intermediate valve between first pump section 101B(1) and second pump section 101B(2) may take the form of an inlet valve for second pump section 101B(2), or even another type of valve formed in the interior of connector 104 or the like. The previous remarks concerning the FIG. 16B embodiment are also applicable to the FIG. 17B embodiment, including remarks regarding the relative sizes and of the respective pump sections 101B(1) and 101B(2) and applications therefore.

While FIG. 17A and FIG. 17B illustrate cascading of modular pump sections 101 of the type of the second embodiment, it will be appreciated that modular pump sections of the type of the third embodiment can also be provided.

Fifth embodiments feature various implementations of pumping systems having one or more pumps which are the same or similar to one or more of the above-described embodiments or implementations thereof. In each example implementation of the fifth example embodiment, a pumping system optionally comprises a mixing device 110; a first pump assembly 120(1) connected by a tube 121(1) to receive fluid from a first fluid source 122 and to deliver the fluid from the first fluid source 122(1) via tube 124(1) (optionally to the mixing device 110); and, a second pump assembly 120(2) connected to receive fluid through tube 121(2) from a second fluid source 122(2) and to deliver the fluid from the second fluid source through tube 124(2) (optionally to the mixing device 110). At least one of the first pump assembly 120(1) and the second pump assembly 120(2) comprises a first diaphragm 22 having a first diaphragm edge 28; a second diaphragm 24 having a second diaphragm edge 30; the first diaphragm edge 28 and the second diaphragm edge 30 being at least partially bonded together so that a bellows chamber 26 is formed between the first diaphragm 22 and the second diaphragm 24. The pumping system further comprises drive electronics 130 for applying an electrical signal(s) to the piezoelectric diaphragm(s) for operating the first pump assembly 120(1) and the second pump assembly 120(2) for providing the fluid from the first fluid source 122(1) and the fluid from the second fluid source 122(2) (e.g., optionally to the mixing device 110).

While the pumps of the pumping systems of the fifth embodiment are hereinafter discussed with respect to illustrations of pumps constructed according to the second example embodiment, it should be understood that the pumps of the first embodiment, third embodiment, and fourth embodiment can also be utilized in similar manner with the pumping systems of the fifth embodiment. For example, for any of the implementations of the pumping systems of the fifth embodiment, either one or both of the first pump assembly and the second pump assembly can have a housing which either defines or encloses a pumping chamber. The diaphragm assembly can have an aperture formed therein to permit the bellows chamber to communicate with an interior of the housing, and whereby action of the first diaphragm and the second diaphragm generates a pressure waveform in the bellows chamber and in the interior of the housing for selectively causing impulsion of the fluid through the inlet port into the pumping chamber and expulsion of the fluid from the pumping chamber through the outlet port. In like manner as the second embodiment, the housing can define the pumping chamber. Alternatively, as with the third embodiment, the housing can at least partially enclose a flexible member, with an interior of the flexible member serving as a pumping chamber. Action of the first diaphragm and the second diaphragm generates a pressure waveform in the bellows chamber and in the pumping chamber for selectively causing impulsion of the fluid into the pumping chamber and expulsion of the fluid from the pumping chamber.

Figure 18A:
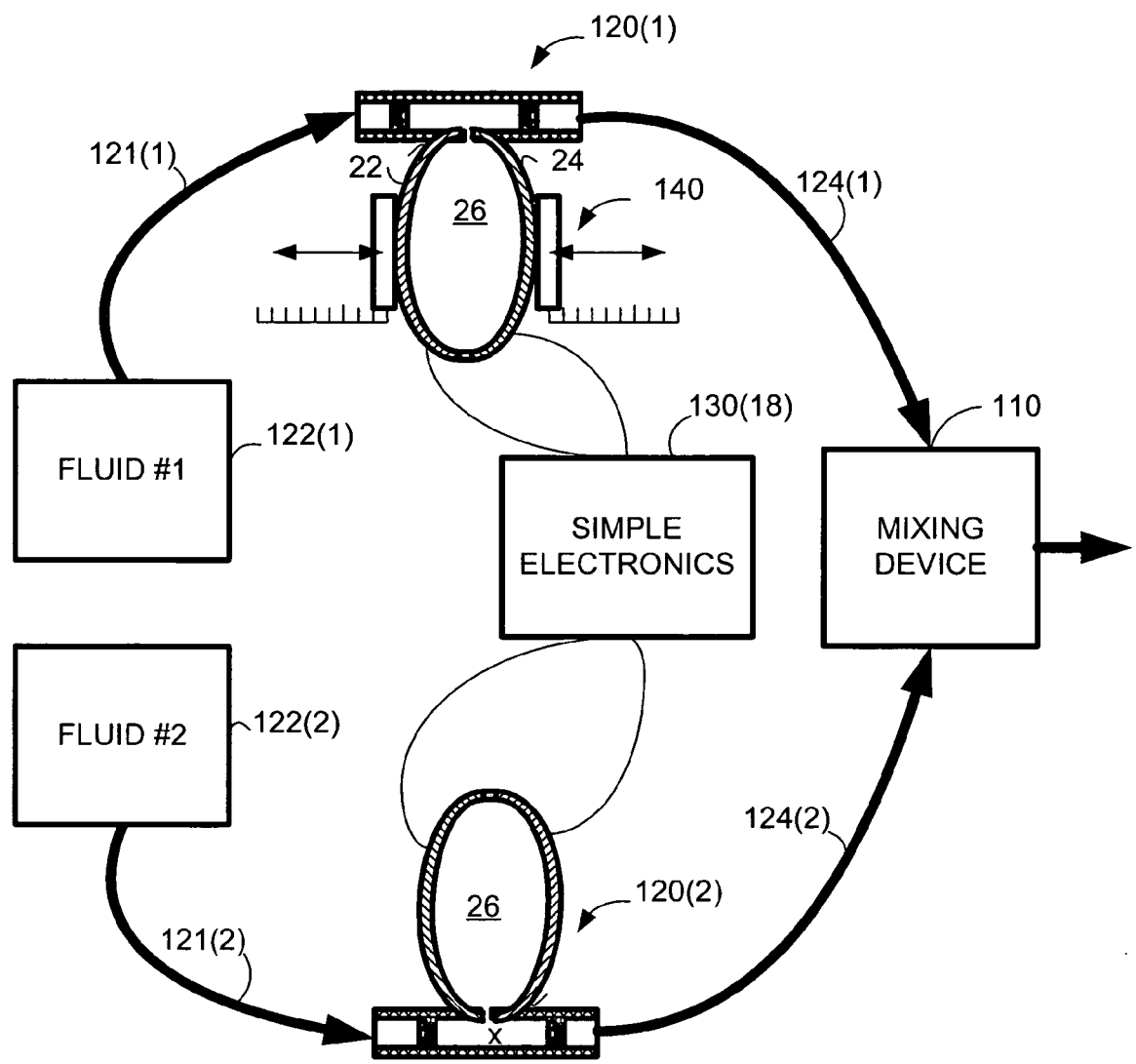
FIG. 18A and FIG. 18B are a partially schematic, partially side cross sectioned, views of pumping systems according to a first example (predominately mechanical) implementation of a fifth example embodiment.
Figure 18B:
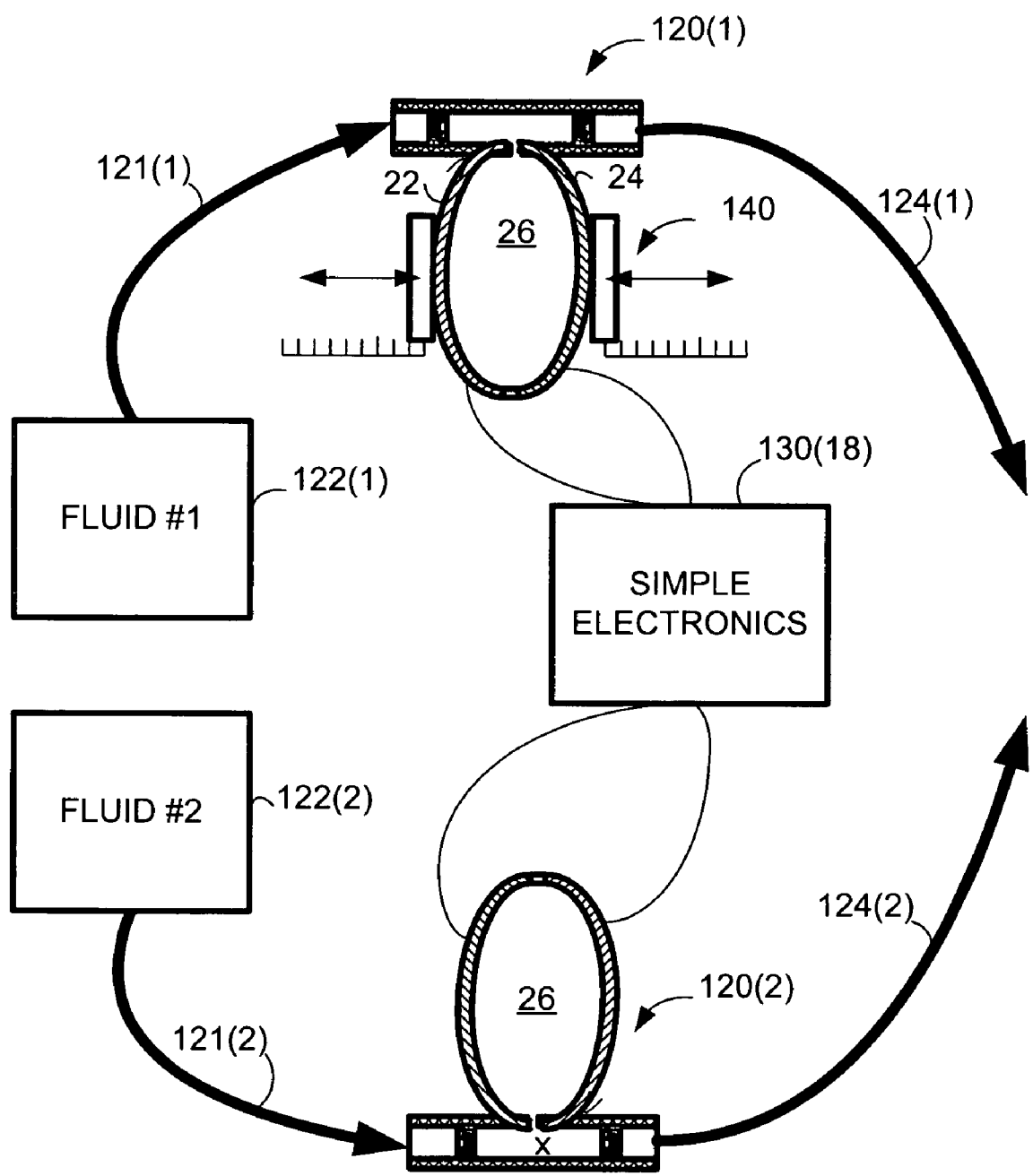

FIG. 18A and FIG. 18B show first example implementations of a fifth example embodiment. In the FIG. 18A and FIG. 18B implementations, the drive electronics 130(18) is a simple drive electronic system which supplies a signal for overdriving both the first pump assembly and the second pump assembly. The electrical signal issued from drive electronics 130(18) can therefore, in at least one example, be a same signal applied to both pump assemblies 120. One or more of the pump assemblies 120 can comprise a physical constraint member 140 having a position selected to limit displacement of one or more of the diaphragms of the pump assembly. In the particular example shown in FIG. 18A and FIG. 18B, only first pump assembly 120(1) has the physical constraint member 140, which limits displacement of the diaphragm 22 and diaphragm 24 of first pump assembly 120(1) despite the pump assembly 120(1) being overdriven. The position of the physical constraint member 140 may be adjustable, e.g., the physical constraint may be adjustable such as, for example, an adjustable stop member whose position is adjustable by setting of a thumb screw or the like. FIG. 18B differs from FIG. 18A by not including mixing device 110, thereby showing that mixing device 110 is optional, e.g., the pumping system can supply or deliver to the user with two independent streams for the user to mix or otherwise utilize.

Figure 19A:
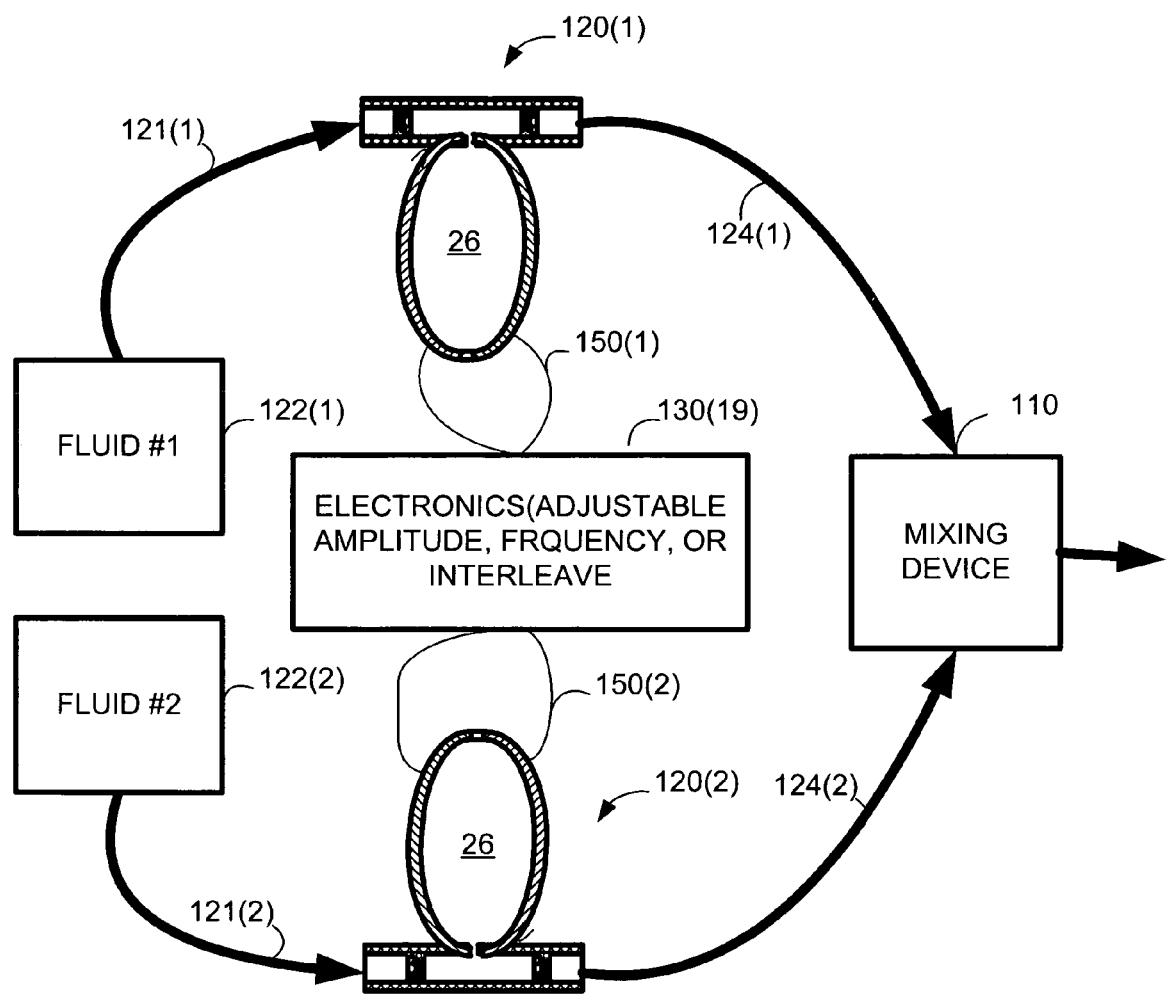
FIG. 19A and FIG. 19B are partially schematic, partially side cross sectioned, views of pumping systems according to a second example (predominately electrical) implementation of a fifth example embodiment.
Figure 19B:
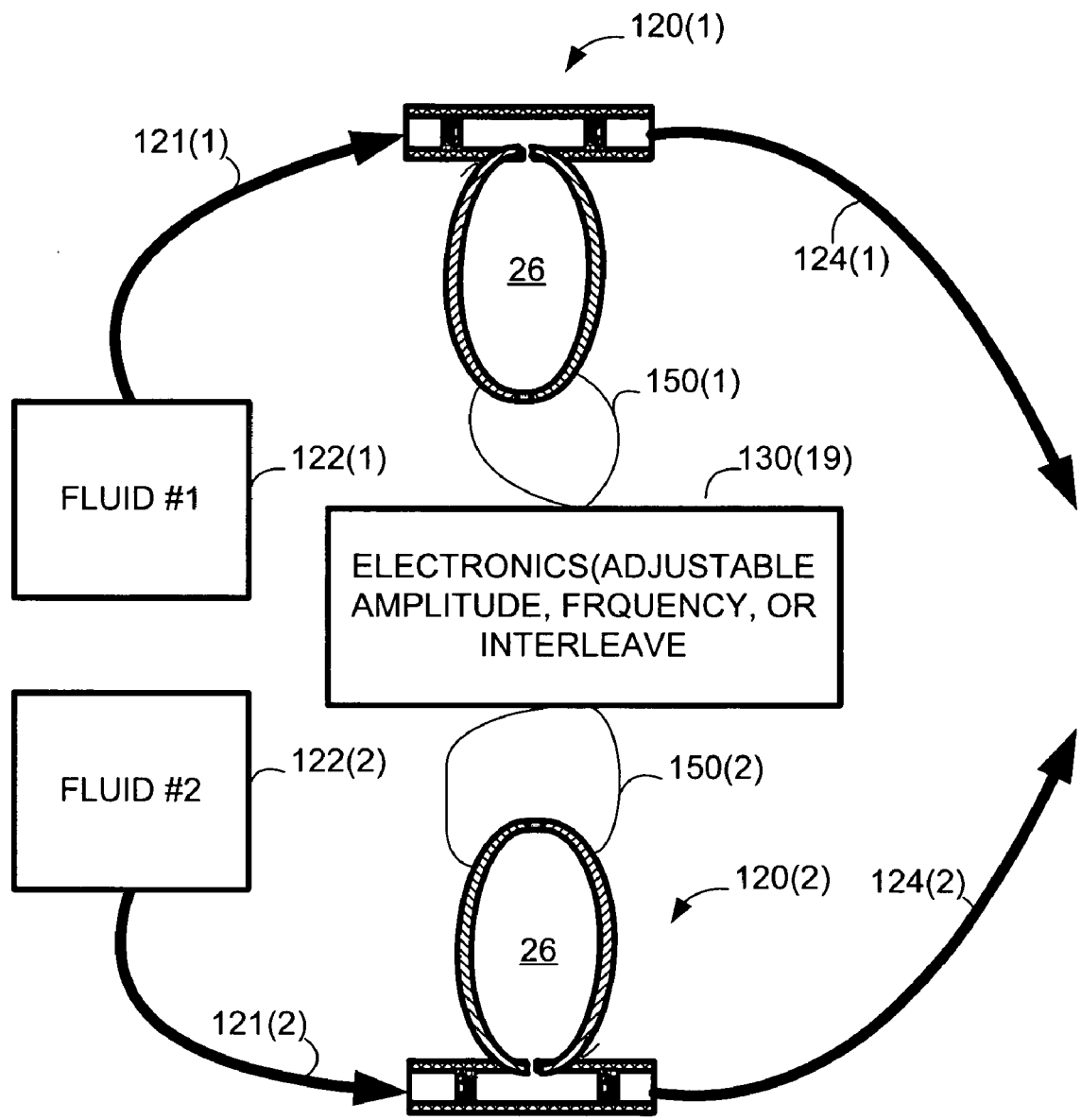

FIG. 19A and FIG. 19B show second example implementations of a fifth example embodiment. In the second example implementations of the fifth embodiment, the drive electronics 130(19) applies a first electrical signal 150(1) to one or both of the piezoelectric diaphragms of the first pump assembly 120(1) and a second electrical signal 150(2) to one or both of the piezoelectric diaphragms of the second pump assembly 120(2). The first electrical signal 150(1) and the second electrical signal 150(2) are applied for controlling a ratiometric mix in the mixing device of the fluid from the first fluid source 122(1) and the fluid from the second fluid source 122(2). For example, the first drive signal 150(1) and the second drive 150(2) signal may differ and be adjustable with regard to one or more of the following parameters: amplitude, frequency, interleave. FIG. 19B differs from FIG. 19A by not including mixing device 110, thereby showing that mixing device 110 is optional, e.g., the pumping system can supply or deliver to the user with two independent streams for the user to mix or otherwise utilize.

Figure 20A:
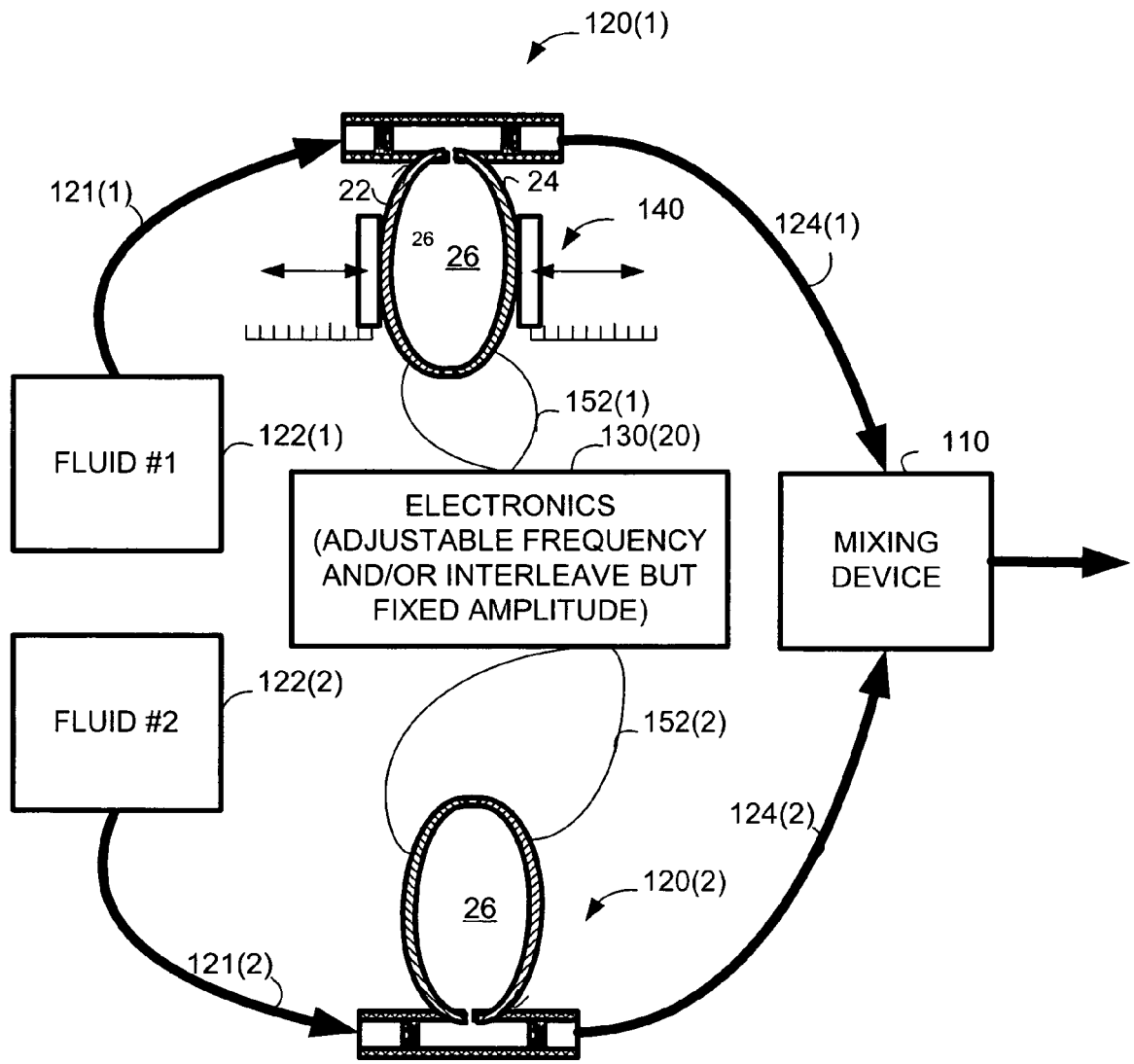
FIG. 20A and FIG. 20B are partially schematic, partially side cross sectioned, views of pumping systems according to a third example (hybrid mechanical/electrical) implementation of a fifth example embodiment.
Figure 20B:
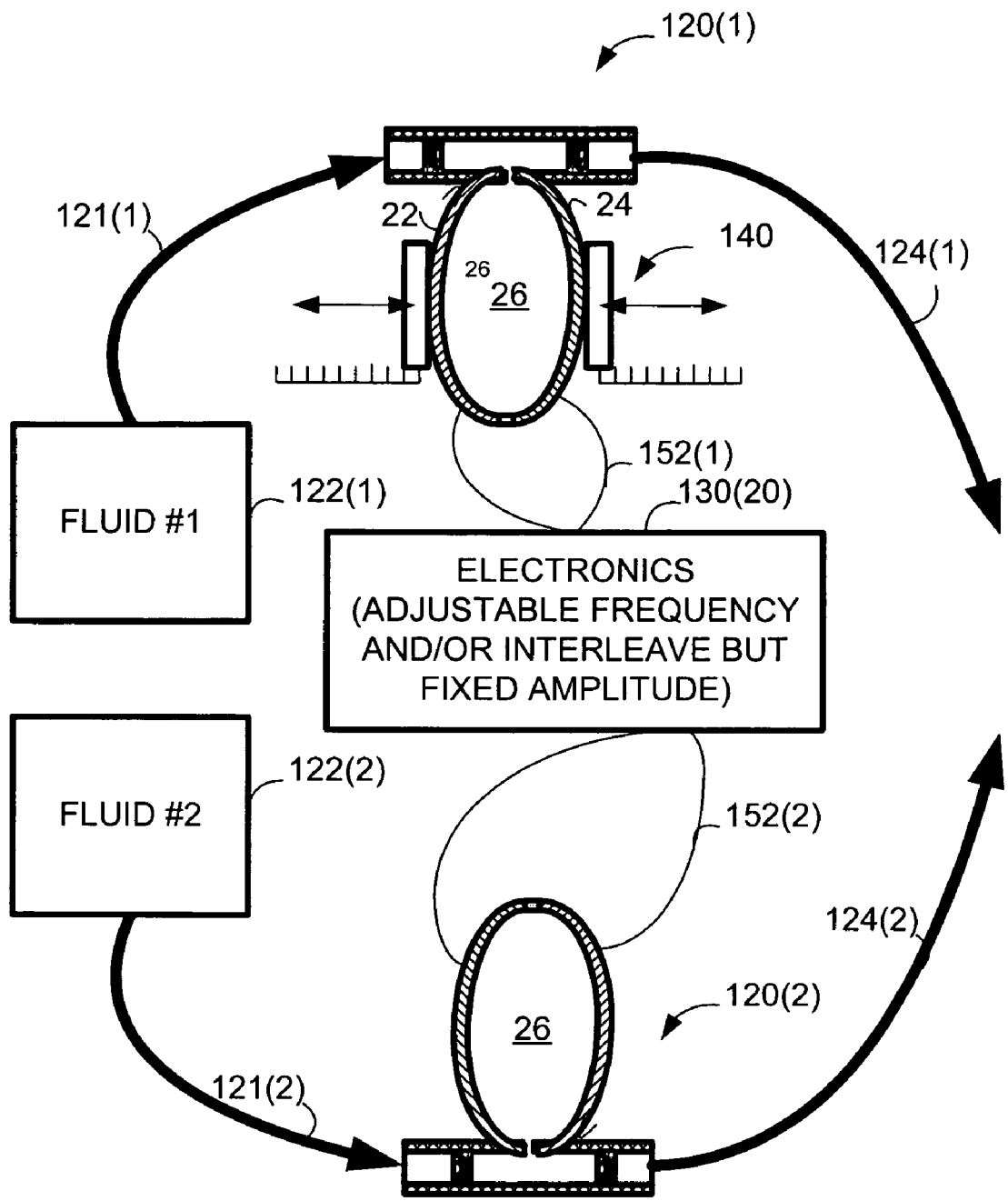

FIG. 20A and FIG. 20B show third example implementations of a fifth example embodiment. The third example implementations are hybrid mechanical/electrical implementations. The third implementation of the fifth embodiment is mechanical in that at least one of the pump assemblies 120 has the physical constraint 140 for limiting diaphragm displacement, and at least one (preferably both) of the pump assemblies 120 are overdriven. The third implementation of the fifth embodiment is electrical in the sense that the first drive signal 152(1) and the second drive signal 152(2) may differ and be adjustable with regard to one or both of frequency and interleave, but not amplitude (the amplitude is fixed). FIG. 20B differs from FIG. 20A by not including mixing device 110, thereby showing that mixing device 110 is optional, e.g., the pumping system can supply or deliver to the user with two independent streams for the user to mix or otherwise utilize.

It will be further appreciated that the fifth embodiment mixing and/or delivery systems can also be accomplished using pump sections other than the bellows-type pump sections herein disclosed, such as by using pump sections taught, for example, in PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", all of which are incorporated herein by reference.

In the embodiments described herein, the first diaphragm edge and the second diaphragm edge are bonded together by various means such as the following examples: over molding; an adhesive sealant; an adhesive gasket. The first diaphragm edge and the second diaphragm edge can be bonded together by an apron (e.g., a polyamide apron). If desired, an electrical lead for carrying the electrical signal to the piezoelectric diaphragm can be embedded in the apron Example structures of diaphragms which include a piezoelectric layer, and methods of fabricating the such diaphragms and pumps incorporating the same, as well as various example pump configurations with which the present invention is compatible, are illustrated in the following (all of which are incorporated herein by reference in their entirety): PCT Patent Application PCT/US01/28947, filed 14 Sep. 2001; U.S. patent application Ser. No. 10/380, 547, filed Mar. 17, 2003, entitled "Piezoelectric Actuator and Pump Using Same"; U.S. patent application Ser. No. 10/380, 589, filed Mar. 17, 2003, entitled "Piezoelectric Actuator and Pump Using Same". In accordance with such example(s), a piezoelectric wafer formed of a polycrystailine ferroelectric material (such as PZT5A) is laminated between a metal substrate layer and an outer metal layer, the bonding agent preferably being a polyimide adhesive. The lamination process does several things, including ruggedizing the piezoelectric layer (since the metal layers keep the piezoelectric from fracturing during high displacement); permits higher voltage due to the relatively high dielectric constant of the polyimide adhesive (thereby allowing up to about twice the displacement of a conventional piezoelectric); makes the diaphragm highly resistant to shock and vibrations; permits the diaphragm to be used in environments as hot as a continuous 200° C. (compared to only 115° C. for a conventional piezoelectric).

Thus, conventional pump housings are replaced with a second diaphragm that is edge bonded to another diaphragm, e.g., to a piezoelectric diaphragm. The second diaphragm may be passive, such as a dome-shaped disk, or active, such as a second piezoelectric diaphragm. In either case, the troublesome seal/mount of the prior art is avoided by replacement of the edge bond which, in operation, sees virtually no movement relative to itself. The edges of this new pump assembly are allowed to move freely together.

In the operation of the two active diaphragm implementation, on the intake or suction stroke the two diaphragms 22 and 24 bow out together, shrinking in diameter together and opposing each other longitudinally in force along the bonded edge and against the trapped fluid. The enclosed volume between the two diaphragms grows like a blacksmith's bellows, and fluid is sucked in through the intake valve. On the exhaust or pump stroke, the two diaphragms 22 and 24 flatten out together, grow in diameter together, and pull against each other along the edge bond and against the trapped fluid, pushing fluid out through the outlet or exhaust port. Considering both the effect of two bowing diaphragms as opposed to one diaphragm, and the effect of greatly reduced diaphragm constraint, per stroke volumetric displacement is increased by a factor of somewhere between two and four. In addition, the pump assembly can be made with much smaller compliance and what compliance there is left is diluted by the swamping effect of the greatly increased displacement. This translates into higher delivered operating pressure.

The operation of the single active diaphragm is similar except that instead of moving together under their own power, the non-active diaphragm is forced to bow and flatten by the active diaphragm applying diameter shrinking and expanding forces along its outer perimeter. Thus, the previously wasted radial motion of the single diaphragm is translated into longitudinal deflection in the passive diaphragm and the per stroke displacement is increased.

Valves are mounted on the pumps herein described in such a way as to increase the performance (e.g., opening and closing speed) of one or more of the valves.

In the first example embodiment, holes are formed in one or both of the first diaphragm 22 and the second diaphragm 24 to allow for incoming and outgoing fluid. An intake valve may be mounted on diaphragm 22 and an outlet valve mounted on diaphragm 24, e.g., the valves may be mounted axially over top of two holes in opposing diaphragms. The entire assembly is free to vibrate. The valve seats are rigidly fixed to the diaphragms in such a way that the motion of the diaphragms complements the action of the valves. In other words, instead of the valves operating passively purely under the influence of the moving fluid, the valve seats are now driven toward the valving elements under the power of the diaphragms at the same time that the valving elements are being driven toward the seats by the fluid. Thus, the valves operate much more quickly. Even in implementations in which one of the two diaphragms is mounted rigidly and the other diaphragm is allowed to move freely, there is still one valve which is active, which provides some benefit.

The pumps of the second example embodiment and the third example embodiment do not have holes in the diaphragms. Instead, an aperture is formed in the diaphragm assembly, e.g., along one edge of the diaphragm assembly a gap is formed in the gasket or seal. This diaphragm/gap assembly is mounted to a housing (e.g., a simple piece of tubing) that can either serve as a pumping chamber or a pressure chamber, such that the gap opens into the chamber formed in the housing.

In operation of the second and third embodiments, the opposing diaphragms (of which one or both can be piezoelectric diaphragms) deflect and produce volumetric changes in the cavity (e.g., bellows chamber 26) that separates diaphragm 22 and diaphragm 24, which in turn produces a pressure waveform in the cavity in the housing (e.g., chamber housing 72).

In the second embodiment the pressure waveform acts upon the check valves (e.g., inlet valve 82 and outlet valve 84), producing a pumping action in the pumping chamber 70. The fluid thus essentially no longer flows through the bellows chamber 26. Instead, the fluid flow, for the most part, is in the clean laminar tubing or housing with minimal back and forth flow (minimal friction) in the bellows chamber 26 defined by one or more piezoelectric diaphragms. Such flow in the bellows chamber 26 in fact diminishes to zero as one traverses the bellows chamber 26 to the opposing edge (e.g., the flow is less in the bellows chamber 26 farthest from the communication aperture 76).

In the third example embodiment, the pressure waveform generated in the bellows chamber 26 need only be "applied" to the fluid being pumped. It is not necessary for the fluid in the bellows chamber 26 to intermingle with the pumped fluid. In the third embodiment, there are two separate fluid cavities that are isolated from each other by the flexible member 90 (e.g., by a wall of a flexible tube, for example). The fluid in pressure chamber 88 is installed at the time of manufacture. The piezoelectric pressure waveform generated in bellows chamber 26 is exerted on the fluid being pumped within pumping chamber 92. The third embodiment pumps are very suited to medical applications or other applications wherein a sterile fluid field needs protection or in industrial application wherein a caustic and/or extremely clean fluid are being managed.

There are many ways that can be used to achieve a reliable, fluid-tight edge seal for the diaphragm 22 and diaphragm 24 of the diaphragm assembly. These techniques include over molding, simple adhesive sealants, or adhesive perform gaskets, for example. It is also possible to laminate the two diaphragms together using a suitable plastic lamination material. It is possible to fabricate single diaphragms with an oversized layer (e.g., polyamide) that forms an apron around the diaphragm. Alternatively, polyamide or some other suitable material could simply be placed on either side of the two diaphragms and the diaphragms then laminated together. Suitable electrical feedthroughs (e.g., electrical connection lines) could even be embedded in the lamination material for electrical pickup, and thus pigtails as used conventionally could be eliminated. An advantage of external laminating is that the outer diaphragm electrodes are electrically insulated, allowing the pump assembly to be more readily submergible and/or applied to differential pumping action.

There are myriad benefits and advantages to the embodiments described herein. Included among these benefits and advantages are the following: higher stroke displacement;

less base compliance combined with a higher displacement/compliance ratio, yielding higher pressure and better efficiency; higher volume, higher pressure; no pump housing is required for better final product integration; active valves potential for better performance; lower operating frequencies required for a given application, thereby reducing power consumption; less noise due to elimination of the pump housing (which otherwise might serve as a "sounding board"); lower cost; ready susceptibility to differential or submersible applications (with a simple insulation layer covering the positive electrodes and any connections, the pump can be submerged and/or operated in a differential mode at virtually any ambient pressure).

Benefits and advantages of the second and third embodiments include those mentioned above, as well as other benefits and advantages. For example, there is no need to form holes in the diaphragms, and mechanical stress on the diaphragms is isolated. In the prior art, it was necessary to mount tubing or valves to the piezoelectric diaphragms in such a way that mechanical stress was potentially applied to the piezoelectric diaphragms, sometimes fracturing the diaphragms or creating leaks. In the "single point mount" of the second and third embodiments, the diaphragm assembly is allowed to "float" in an installed application, and thus not susceptible to mechanical stress. Moreover, more direct fluid flow and less diaphragm friction as facilitated by these embodiments results in better pump performance.

Another benefit and advantage is that of better self-priming. Reduced flow through the pump allows for smaller diaphragm separation geometries, increasing the compression ratio and the self-priming capabilities. In up and down configurations (e.g., vertical orientations), fluid may tend to remain in the bellows chamber 26, further increasing the compression ratio of the pump and greatly improving the self-priming after an initial "wetting" prime. If desired, the wetting prime can be eliminated by employing the third embodiment. These factors also allow the pump to much more effectively handle air/fluid mixtures.

Another benefit and advantage is less noise and lower cost electronics. The opposing diaphragms forming the diaphragm assembly greatly increases volumetric displacement and thus valve/pump efficiency and allows for the pump to operate at a lower frequency for a given application. Furthermore, the noise canceling tendency of the opposing diaphragms design for the diaphragm assembly, combined with the noise isolation benefit of the single point mount (of the second and third embodiments), dramatically reduces noise issues and the need for a special drive waveform. Lower drive electronics and more waveform flexibility translates into simpler and lower cost drive electronics.

The concept of separating the bellows chamber 26 from the actual pumping circuit, as shown in the second and third embodiments, allows for much more pump application versatility.

The implementations of the fifth embodiment advantageously ratiometrically dispense two or more fluids. Many configurations are possible as including two or more pump assemblies that are under mechanical control (see FIG. 18A and FIG. 18B), electronic control (see FIG. 19A and FIG. 19B), or electro-mechanical control (see FIG. 20A and FIG. 20B) such that the volumetric output of at least one of the pump assemblies can be controlled or adjusted. The pumps are fed from separate fluid supplies and the output of one or more of the pumps is adjusted such that the output of the system is a fluid mix of the desired mix ratio. The output may be used as simple as separate streams that are dispensed into a container to be mixed and later used by the operator, or alternatively the device can incorporate a mixing chamber and/or nozzle so that the ratiometric mix could be dispensed directly by the user. Examples include the mixing of pesticide/herbicide; window or other cleaner; machine tool coolant/lubricants, and the like.

Many plumbing configurations for the fifth embodiment are possible. Perhaps the most straightforward configurations are those shown in FIG. 18A-FIG. 20A, FIG. 18B-FIG. 20B, where two or more pump assemblies are positioned in parallel, both feeding a mixing chamber or nozzle that would squirt or spray an end (mixed) product. Alternatively, for better mixing, it might be desirable to plumb the pumps in semi-serial fashion.

Various ways of controlling output of the individual pump assemblies are possible. It some applications it is not important to know how much fluid is being dispensed, only that a reasonably accurate ratio be maintained. Design constraints are simplified in such applications, especially if ratios are often forgiving.

The first implementation of the fifth embodiment as depicted in FIG. 17 involves low cost drive electronics that can be used to overdrive first pump assembly 120(1) and first pump assembly 120(2). The pumps could be driven such that the strokes interleave at a 1:1 ratio. The first pump assembly 120(1) could be constrained to a fixed output and second pump assembly 120(2) may have a user adjustable device (e.g., screw) that can be used to change the constraints thereof, and thus vary the mix ratio. This first implementation can use low cost electronics, can be potentially very accurate, tolerant of variations in the piezoelectric diaphragm(s), and easy to manufacture.

The second implementation of the fifth embodiment is primarily electrical. The first pump assembly 120(1) and second pump assembly 120(2) are driven without physical constraints and by more sophisticated electronics that are able to vary the drive amplitude to at least one of the pump assemblies and also to vary the pump interleave ratio and/or the pump frequency. Configurations of the second implementation depend on piezoelectric matching and/or calibration information stored in the electronics (e.g., in a controller of the electronics). The second implementation has great accuracy, can incorporate more features, and can elegantly dealing with any priming considerations. Examples of driving signals for the drive electronics of the second implementation of the fifth embodiment, or for any other embodiment described herein, are described in U.S. patent application Ser. No. 10/815,978, filed Apr. 2, 2004 by Vogeley et al., entitled "Piezoelectric Devices and Methods and Circuits for Driving Same", which is incorporated herein by reference in its entirety, or by documents referenced and/or incorporated by reference therein.

The third implementation of the fifth embodiment is the hybrid implementation, where the pump assemblies are constrained to a fixed mix ratio and are electrically driven. The mix ratio is adjusted by varying the interleave ratio and/or the drive frequency of one or both pump assemblies. The third implementation is tolerant of piezoelectric variations, primes readily, and yet could be designed with lower cost electronics than the second implementation of the fifth embodiment.

For repeatable and consistent performance (e.g., for accommodating varying reservoir fluid levels, etc), it may be preferred for the pumps to operate in a pure positive displacement mode, facilitated by having the pump assemblies configured in accordance with either the second example embodiment or the third example embodiment, for example.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A pump comprising:
   a first piezoelectric diaphragm having a first piezoelectric diaphragm edge;
   a second piezoelectric diaphragm having a second piezoelectric diaphragm edge;
   a bond formed essentially around peripheries of the first piezoelectric diaphragm edge and the second piezoelectric diaphragm edge so that a bellows chamber is formed between the first piezoelectric diaphragm and the second piezoelectric diaphragm and in a manner so that the first piezoelectric diaphragm edge and the second piezoelectric diaphragm edge exert a force against each other when displaced;
   an inlet port formed in the first piezoelectric diaphragm or the second piezoelectric diaphragm;
   an outlet port formed in the first piezoelectric diaphragm or the second piezoelectric diaphragm.

2. The apparatus of claim 1, further comprising a driver for applying the electrical signal to the first piezoelectric diaphragm and the second piezoelectric diaphragm to cause the first piezoelectric diaphragm and the second pie diaphragm to bow outwardly together and thereby shrink in diameter during a suction stroke and causing the first piezoelectric diaphragm and the piezoelectric second diaphragm to flatten out and increase in diameter during a pump stroke.

3. The apparatus of claim 1, wherein the inlet port is formed in a central region of the first piezoelectric diaphragm and the outlet port is formed in a central region of the second piezoelectric diaphragm; and wherein the first piezoelectric diaphragm edge and the second piezoelectric diaphragm edge are essentially entirely bonded together whereby the bellows chamber forms a pumping chamber, with fluid being admitted into the pumping chamber through the inlet port and being expelled from the pumping chamber through the outlet port.

4. The apparatus of claim 3, wherein the inlet port and the outlet port are axially offset with respect to a major axis of the first piezoelectric diaphragm and the second piezoelectric diaphragm.

5. The apparatus of claim 3, further comprising:
   an inlet valve provided at the inlet port, the inlet valve having an inlet valve seat which is carried by the first piezoelectric diaphragm, the inlet valve being driven closed on a suction stroke of the pump but being driven open on a pump stroke;
   an outlet valve provided at the outlet port, the outlet valve having an outlet valve seat which is carried by the second piezoelectric diaphragm; the outlet valve being driven open during the suction stroke but driven closed on the pump stroke.

6. The apparatus of claim 5, wherein one of the inlet valve and the outlet valve serves as a stationary mounting valve, and wherein neither the first piezoelectric diaphragm nor the second piezoelectric diaphragm contacts any stationary structure except the mounting valve.

7. The apparatus of claim 5, further comprising a stationary pump holder which serves to suspend the pump so that neither the first piezoelectric diaphragm nor the second piezoelectric diaphragm contacts any stationary structure and so that both the inlet valve and outlet valve are unconstrained active valves.

8. The apparatus of claim 1, wherein the inlet port is formed in the first piezoelectric diaphragm and the outlet port is formed in the first piezoelectric diaphragm; and wherein the first piezoelectric diaphragm edge and the second piezoelectric diaphragm edge are essentially entirely bonded together whereby the bellows chamber forms a pumping chamber, with fluid being admitted into the pumping chamber through the inlet port and being expelled from the pumping chamber through the outlet port.

9. The apparatus of claim 8, wherein the second piezoelectric diaphragm is secured or connected to a stationary mounting structure, but the first piezoelectric diaphragm does not contact any stationary structure.

10. The apparatus of claim 3, further comprising a driver for applying the electrical signal to whichever of the first piezoelectric diaphragm and the second piezoelectric diaphragm is the piezoelectric diaphragm for causing the first piezoelectric diaphragm and the second piezoelectric diaphragm to bow outwardly together and thereby shrink in diameter for sucking the fluid into the bellows chamber and for causing the first piezoelectric diaphragm and the second piezoelectric diaphragm to flatten out and increase in diameter for expelling the fluid from the bellows chamber.

11. The apparatus of claim 1, wherein the first piezoelectric diaphragm edge and the second piezoelectric diaphragm edge are bonded together by at least one of the following: over molding; an adhesive sealant; an adhesive gasket.

12. The apparatus of claim 1, wherein the first piezoelectric diaphragm edge and the second piezoelectric diaphragm edge are bonded together by a laminate.

13. The apparatus of claim 12, wherein an electrical lead for carrying the electrical signal to the piezoelectric diaphragm is embedded in the laminate.

14. A modular, cascadeable pump component comprising:
    a first piezoelectric diaphragm having a first piezoelectric diaphragm edge;
    a second piezoelectric diaphragm having a second piezoelectric diaphragm edge;
    a bond formed essentially around peripheries of the first piezoelectric diaphragm edge and the second piezoelectric diaphragm edge so that a bellows chamber is formed between the first piezoelectric diaphragm and the second piezoelectric diaphragm and in a manner so that the first piezoelectric diaphragm edge and the second piezoelectric diaphragm edge exert a force against each other when displaced;
    an inlet port formed in the first piezoelectric diaphragm or the second piezoelectric diaphragm;
    an outlet port formed in the first piezoelectric diaphragm or the second piezoelectric diaphragm;
    wherein at least one of the inlet port or the outlet port is configured for connection to another pump component.

15. The apparatus of claim 14, further comprising a driver for applying an electrical signal to the first piezoelectric diaphragm and to the second piezoelectric diaphragm, the electrical signal causing the first piezoelectric diaphragm and the second piezoelectric diaphragm to bow outwardly together and thereby shrink in diameter during a suction stroke and causing the first piezoelectric diaphragm and the second piezoelectric diaphragm to flatten out and increase in diameter during a pump stroke.

16. The apparatus of claim 14, wherein the first diaphragm edge and the second diaphragm edge are bonded together by at least one of the following: over molding; an adhesive sealant; an adhesive gasket.

17. The apparatus of claim 14, wherein the first diaphragm edge and the second diaphragm edge are bonded together by a laminate.

18. The apparatus of claim 17, wherein an electrical lead for carrying the electrical signal to the piezoelectric diaphragm is embedded in the laminate.

* * * * *